US012380834B2

(12) United States Patent
Xi et al.

(10) Patent No.: US 12,380,834 B2
(45) Date of Patent: Aug. 5, 2025

(54) APPARATUS FOR A MICRO-LED DISPLAY

(71) Applicant: Intel Corporation, Santa Clara, CA (US)

(72) Inventors: Peng-Bo Xi, New Taipei (TW); Yi-Chuan Liu, Zhubei (TW); Jackson Tsai, New Taipei (TW)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/710,098

(22) Filed: Mar. 31, 2022

(65) Prior Publication Data

US 2022/0223102 A1    Jul. 14, 2022

(51) Int. Cl.
| | |
|---|---|
| *G09G 3/32* | (2016.01) |
| *H01L 25/075* | (2006.01) |
| *H10H 20/01* | (2025.01) |
| *H10H 20/854* | (2025.01) |
| *H10H 20/857* | (2025.01) |

(52) U.S. Cl.
CPC ........... *G09G 3/32* (2013.01); *H01L 25/0753* (2013.01); *H10H 20/01* (2025.01); *H10H 20/854* (2025.01); *H10H 20/857* (2025.01); *G09G 2300/0404* (2013.01); *H10H 20/0362* (2025.01); *H10H 20/0364* (2025.01)

(58) Field of Classification Search
CPC ... G09G 3/32; G09G 2300/0404; H01L 33/62
See application file for complete search history.

(56) References Cited

U.S. PATENT DOCUMENTS

| | | | |
|---|---|---|---|
| 10,026,721 B2 | 7/2018 | Kim et al. | |
| 10,770,440 B2 | 9/2020 | England et al. | |
| 11,574,585 B1 * | 2/2023 | Su | H01L 25/0753 |
| 2015/0332635 A1 | 11/2015 | Lau et al. | |
| 2018/0197471 A1 | 7/2018 | Rotzoll et al. | |
| 2021/0391381 A1 * | 12/2021 | Asada | H01L 33/54 |
| 2022/0165619 A1 * | 5/2022 | Hotta | H01L 21/76877 |
| 2022/0223103 A1 | 7/2022 | Xi et al. | |
| 2023/0215342 A1 | 7/2023 | Boecker et al. | |

FOREIGN PATENT DOCUMENTS

CN          110287808 A      9/2019

OTHER PUBLICATIONS

Madden et al., "Advancing High Performance Heterogeneous Integration Through Die Stacking," 2012 Proceedings of the ESSCIRC, Sep. 17-21, 2012, 7 pages.
United States Patent and Trademark Office, "Non-Final Office Action," issued in connection with U.S. Appl. No. 17/711,992, dated May 2, 2025, 12 pages.

* cited by examiner

Primary Examiner — Eliseo Ramos Felicoano
Assistant Examiner — Mikka Liu
(74) Attorney, Agent, or Firm — Hanley, Flight & Zimmerman, LLC

(57) ABSTRACT

Apparatus, methods, and articles of manufacture for a micro-LED display are disclosed. An example apparatus for a micro-LED display includes a substrate, a micro-LED matrix on a first side of the substrate, a driver circuit on a second side of the substrate, the second side opposite the first side, and a conductive path in the substrate to extend between the first side and the second side to electrically couple the micro-LED matrix to the driver circuit.

18 Claims, 13 Drawing Sheets

APPARATUS FOR A MICRO-LED DISPLAY

FIELD OF THE DISCLOSURE

This disclosure relates generally to micro-LEDs and, more particularly, to apparatus, methods, and articles of manufacture for a micro-LED display.

BACKGROUND

In recent years, micro-LED (micro-light emitting diode) display technology has been the focus of considerable research and development. Among other advantages, micro-LED displays show promise of consuming three to five times less power than OLED (organic LED) displays.

Figure 1:
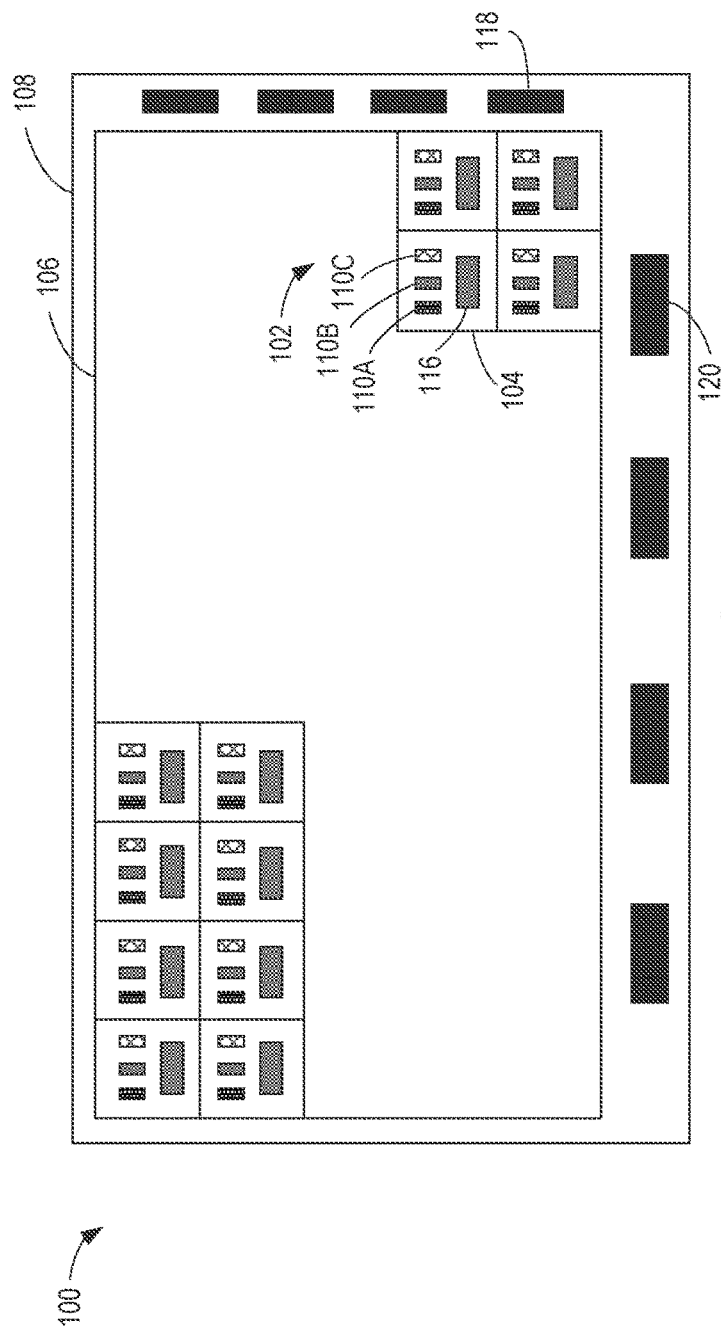
FIG. 1 illustrates a known micro-LED display including an array of known pixel devices.

In general, the same reference numbers will be used throughout the drawing(s) and accompanying written description to refer to the same or like parts. The figures are not necessarily to scale. Instead, the thickness of the layers or regions may be enlarged in the drawings. Although the figures show layers and regions with clean lines and boundaries, some or all of these lines and/or boundaries may be idealized. In reality, the boundaries and/or lines may be unobservable, blended, and/or irregular.

As used herein, unless otherwise stated, the term "above" describes the relationship of two parts relative to Earth. A first part is above a second part, if the second part has at least one part between Earth and the first part. Likewise, as used herein, a first part is "below" a second part when the first part is closer to the Earth than the second part. As noted above, a first part can be above or below a second part with one or more of: other parts therebetween, without other parts therebetween, with the first and second parts touching, or without the first and second parts being in direct contact with one another.

Notwithstanding the foregoing, in the case of a semiconductor device, "above" is not with reference to Earth, but instead is with reference to a bulk region of a base semiconductor substrate (e.g., a semiconductor wafer) on which components of an integrated circuit are formed. Specifically, as used herein, a first component of an integrated circuit is "above" a second component when the first component is farther away from the bulk region of the semiconductor substrate than the second component.

As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween.

As used herein, connection references (e.g., attached, coupled, connected, and joined) may include intermediate members between the elements referenced by the connection reference and/or relative movement between those elements unless otherwise indicated. As such, connection references do not necessarily infer that two elements are directly connected and/or in fixed relation to each other. As used herein, stating that any part is in "contact" with another part is defined to mean that there is no intermediate part between the two parts.

Unless specifically stated otherwise, descriptors such as "first," "second," "third," etc., are used herein without imputing or otherwise indicating any meaning of priority, physical order, arrangement in a list, and/or ordering in any way, but are merely used as labels and/or arbitrary names to distinguish elements for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for identifying those elements distinctly that might, for example, otherwise share a same name.

As used herein, "approximately" and "about" refer to dimensions that may not be exact due to manufacturing tolerances and/or other real world imperfections. As used herein "substantially real time" refers to occurrence in a near instantaneous manner recognizing there may be real world delays for computing time, transmission, etc. Thus, unless otherwise specified, "substantially real time" refers to real time+/−1 second.

DETAILED DESCRIPTION

Micro-LED displays produce light in response to current flowing through individual micro-LEDs of the display. Micro-LEDs include inorganic structures with typical "on" voltage drops ranging from 1.9 volts (V) to 3 V depending on a color displayed. In some instances, micro-LEDs are arranged in a two-dimensional array (e.g., matrix) of elements to provide a display. Unlike organic LEDs (OLEDs), micro-LEDs utilize inorganic compounds (e.g., gallium nitride) that are illuminated when supplied with current as opposed to organic compounds used in OLED displays. As used herein, the term "micro-LED" is not limited to a specific LED dimension. However, in some examples, the micro-LEDs have a dimension (e.g., a length and/or a width) that is less than 100 micrometers. For example, a size of the micro-LEDs can be less than or equal to 100 micrometers by 100 micrometers. In some examples, the size of the micro-LEDs can be less than or equal to 30 micrometers by 30 micrometers.

Active-matrix micro-LED displays provide high-resolution color graphics with a high refresh rate. In some examples, the display includes at least M×N pixel devices in a matrix having M rows and N columns, including at least one of the M×N pixel devices positioned at each matrix junction where a row intersects a column. Each of the M×N pixel devices includes one or more LEDs and a pixel driver circuit to control the one or more LEDs. In some examples, each of the M×N pixel devices corresponds to an individual element (e.g., a pixel) on a substrate of the display.

Typically, at least one row driver and at least one column driver are used to control individual ones of the pixel devices located at the matrix junctions. For example, the column drivers drive the columns (connected to device anodes) and the row drivers drive the rows (connected to device cathodes). In some examples, the row drivers sequentially scan the rows with a driver switch to a known voltage such as a ground. In operation, information is transferred to the display by scanning each row in sequence. During each row scan period, the column drivers also drive each column in the current row that is connected to an element intended to emit light.

Typical pixel devices conduct current and luminesce (e.g., emit light) when voltage of one polarity is imposed across the pixel devices, and block current when voltage of an opposite polarity is applied. To produce the perception of a grayscale or a full-color image using a micro-LED display at optimal power efficiency, it is necessary to rapidly modulate micro-LEDs of pixel devices of the display between on and off states such that the average of their modulated brightness waveforms correspond to a desired 'analog' brightness for each pixel. This technique is generally referred to as pulse-width modulation (PWM). Above a particular modulation frequency, the human eye and brain integrate a pixel's rapidly varying brightness (and color, in a field-sequential color display) and perceive a brightness (and color) determined by the pixel's average illumination over a period of time (e.g., over a display of a video frame).

PWM operation of micro-LEDs provides improvements in power efficiency when compared to analog driving. However, driving micro-LEDs using pulses of a PWM signal sent from column drivers across display lengths can cause undesired high power consumption and pulse distortion. To address some drawbacks of PWM signals, some micro-LED devices include PWM circuits to control each pixel device. Such PWM circuits may be implemented in a silicon (Si) complementary metal-oxide-semiconductor (CMOS) and transferred to a backplane on the same surface as the micro-LEDs. While this technique may work for large displays that include large pixels (e.g., televisions), as pixel size decreases, such techniques become infeasible to make small enough for products such as laptops and smartphones due to a transistor count of the circuits when implemented with thin-film transistor (TFT) technology. Furthermore, by implementing the PWM circuits on the same surface as the micro-LEDs, known micro-LED devices limit a resolution of a micro-LED display by limiting pixel pitch reduction of the micro-LED display. In particular, the surfaces of the micro-LED devices are sized to accommodate at least the micro-LEDs and the corresponding PWM circuits thereupon, such that a distance between adjacent pixels (e.g., the pixel pitch) is unable to be reduced less than a threshold distance. Additionally, by requiring a large number of the PWM circuits (e.g., one of the PWM circuits per pixel), known micro-LED displays have high manufacturing complexity and parts costs.

As used herein, "pixels" refer to discrete controllable elements of a micro-LED display, where each pixel includes a corresponding cluster of micro-LEDs (e.g., a red micro-LED, a green micro-LED, and a blue micro-LED). As used herein, "pixel pitch" refers to the distance between adjacent pixels in a micro-LED display. As used herein, a "pixel density" and/or "resolution" of the micro-LED display increases when the pixel pitch decreases, and the pixel density and/or the resolution decreases when the pixel pitch increases.

Examples disclosed herein enable a reduction in pixel pitch (e.g., an increase in pixel density) of a micro-LED display by providing a micro-LED array (e.g., matrix) of micro-LEDs on a first side of a substrate (e.g., a polyimide substrate) and corresponding drivers (e.g., matrix driver circuits and/or assist driver circuits) on a second side of the substrate opposite the first side. In examples disclosed herein, conductive paths in the substrate electrically couple the micro-LEDs of the micro-LED array to the corresponding drivers. In some examples, etching, laser removal, and/or polishing of the second side of the substrate is used to expose the conductive paths, thus exposing contact pads on the second side. In some examples, each of the matrix driver circuits is to control multiple ones of the micro-LEDs. Advantageously, examples disclosed herein reduce a number of drivers to be implemented in a micro-LED display, thus reducing parts costs for the display. Additionally, examples disclosed herein enable an increase in pixels per inch (PPI) of the display by reducing the pitch between the individual pixels, thus improving a resolution of the display.

FIG. 1 illustrates a known micro-LED display 100 including a micro-LED array 102. In some instances, the known micro-LED display 100 can be implemented on an electronic device such as a laptop, a tablet, a smartphone, a smartwatch, a television, a computer monitor, etc. In FIG. 1, the micro-LED array 102 includes known pixel devices 104 arranged in a two-dimensional matrix on an active area 106 of a panel (e.g., a micro-LED panel) 108. In FIG. 1, each of the known pixel devices 104 corresponds to an individual pixel of the known micro-LED display 100. While reference is made to one of the known pixel devices 104, description and/or illustration associated with the one of the known pixel devices 104 can be considered to apply equally to each of the known pixel devices 104 of FIG. 1.

In FIG. 1, each of the known pixel devices 104 includes one or more micro-LEDs 110. For instance, the known known pixel device 104 in FIG. 1 includes a first micro-LED 110A, a second micro-LED 110B, and a third micro-LED 110C on a surface of the known pixel device 104. In some instances, the different micro-LEDs 110 on the known pixel device 104 correspond to different colored lights. For instance, the first, second, and third micro-LEDs 110A, 110B, 110C of FIG. 1 correspond to red, green, and blue colored lights, respectively. As illustrated in FIG. 1, each of the known pixel devices 104 further includes a known pixel driver 116 on the same surface of the known pixel devices 104 as the micro-LEDs 110. The known pixel driver 116 is electrically coupled to each of the micro-LEDs 110 to control operation thereof. For instance, the known pixel driver 116 can control a signal (e.g., a current) provided to ones of the micro-LEDs 110, where the signal can be used to turn on the ones of the micro-LEDs 110 and/or vary a brightness thereof. As represented in FIG. 1, each known pixel device 104 has a separate known pixel driver 116 to control the micro-LEDs 110 on each corresponding known pixel device 104. In some instances, the known pixel driver 116 corresponds to a self-contained integrated circuit (IC) chip mounted to the surface of the known pixel device 104.

As shown in FIG. 1, the known micro-LED display 100 includes row drivers (e.g., row driver circuits) 118 and column drivers (e.g., column driver circuits) 120 on the panel 108 outside of the active area 106. In some instances, the known pixel drivers 116 are driven by the column drivers 120 and the row drivers 118. For instance, the column drivers 120 supply a low frequency signal (e.g., a sawtooth wave signal, a triangular/triangle wave signal, etc.) while the row drivers 118 supply a scan signal to selectively pass a data signal representative of an image to be displayed to activate the micro-LEDs 110 of the known pixel devices 104 of a particular row of the known micro-LED display 100. The data signal may be supplied to the known micro-LED display 100 from a digital-to-analog converter (DAC) to drive the known micro-LED display 100 to display an image initially represented in digital data. The known pixel drivers 116 convert the low frequency signal into a higher frequency PWM signal having a pulse that is based on the DC voltage of the input data signal. In some instances, the amplitude of the PWM signal is fixed at a level that drives the micro-LEDs 110 at efficient operating current while the pulse width of the PWM signal controls the brightness and/or color of the micro-LEDs 110. While four of the row drivers 118 and four of the column drivers 120 are shown in the illustrated example of FIG. 1, a different number of the row drivers 118 and/or the column drivers 120 may be used instead.

Figure 2:
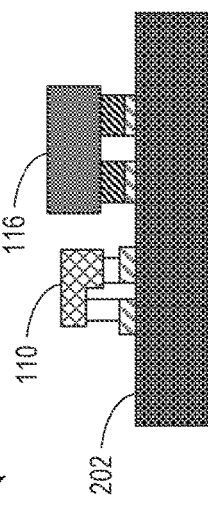
FIG. 2 is a side view of the known pixel device of FIG. 1.

FIG. 2 is a side view of the known pixel device 104 of FIG. 1. As shown in FIG. 2, the known pixel driver 116 and the micro-LED(s) 110 are coupled to a top surface 202 of an example substrate 204 of the known pixel device 104. In some instances, a surface area of the top surface 202 is sized to accommodate placement of the known pixel driver 116 and the micro-LED(s) 110 thereupon. In some instances, increasing a resolution (e.g., pixel count) of the known micro-LED display 100 of FIG. 1 requires a reduction in size of the known pixel devices 104. However, such reduction in size may not be feasible when the known pixel driver 116 and the micro-LED(s) 110 are implemented on the top surface 202 as shown in FIGS. 1 and 2.

Figure 3A:
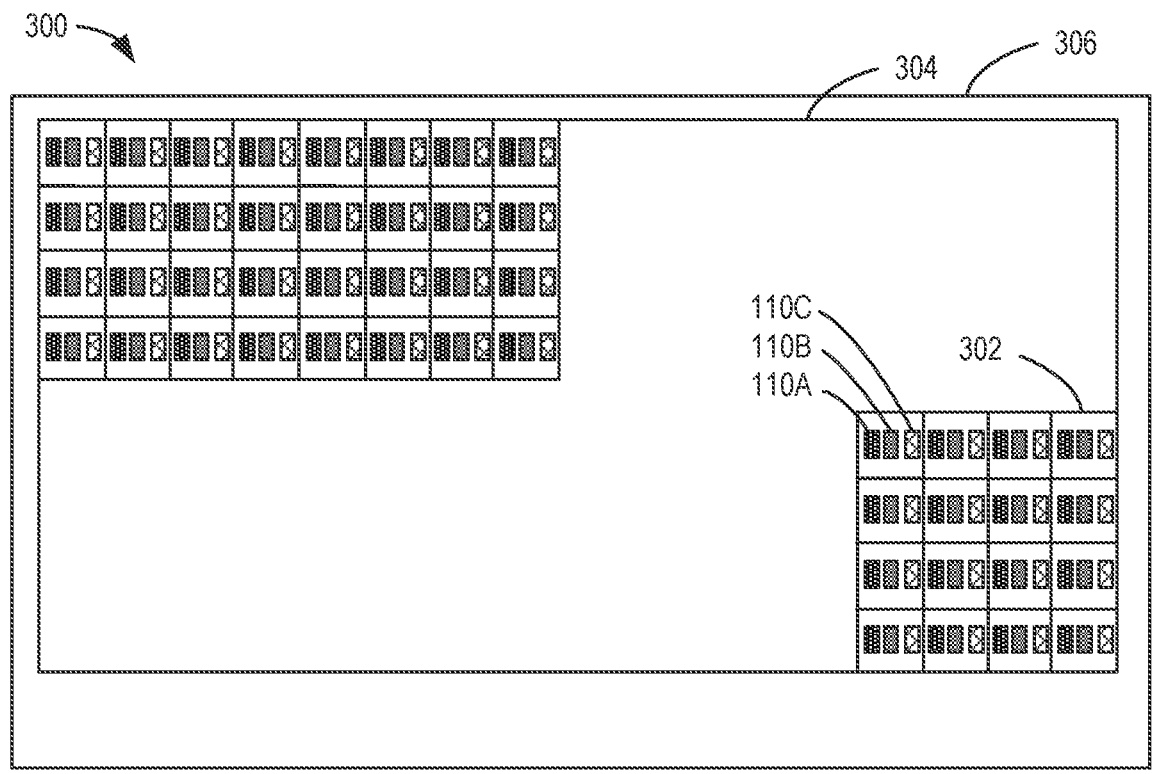
FIG. 3A illustrates a top view of an example micro-LED display in accordance with teachings of this disclosure.
Figure 3B:
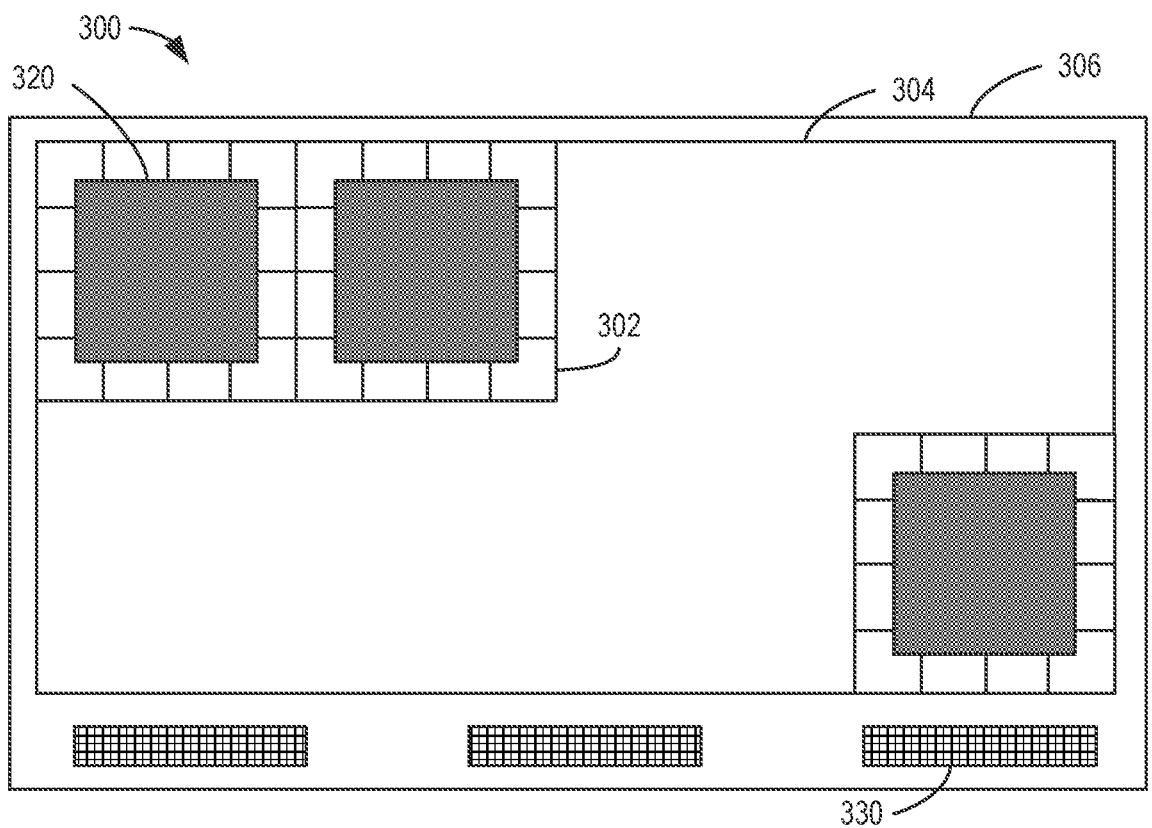
FIG. 3B illustrates a bottom view of the example micro-LED display of FIG. 3A

FIGS. 3A and 3B illustrate a top view and a bottom view, respectively, of an example micro-LED display 300 constructed in accordance with teachings disclosed herein. Unlike the known micro-LED display 100 of FIG. 1, the example micro-LED display 300 of FIG. 3A implements example pixel devices 302 in an M×N array in an example active area 304 of an example panel 306 of the micro-LED display 300. In the illustrated example of FIG. 3A, similar to the known pixel devices 104 of FIG. 1, each of the pixel devices 302 of FIG. 3A corresponds to an individual pixel of the micro-LED display 300 of FIG. 3. Furthermore, each of the pixel device 302 of FIG. 3A includes three of micro-LEDs 110, including a first micro-LED 110A corresponding to a red colored light, a second micro-LED 110B corresponding to a green colored light, and a third micro-LED 110C corresponding to a blue colored light. However, in contrast to the known pixel devices 104 of the micro-LED display 100 of FIG. 1, the example pixel devices 302 of FIG. 3 do not include the known pixel drivers 116 on a top surface of the pixel devices 302 (e.g., adjacent the micro-LEDs 110).

Instead, as shown in the illustrated example of FIG. 3B, example matrix drivers (e.g., matrix driver circuits, IC chips) 320 are on a bottom surface of the pixel devices 302 opposite the top surface on which the micro-LEDs 110 are positioned. In this example, each of the matrix drivers 320 is electrically and/or operatively coupled to corresponding ones of the pixel devices 302. For example, each of the matrix drivers 320 is to control an m×n submatrix of the pixel devices 302, where, in this example, m is less than M total rows of the pixel devices 302 and n is less than N total columns of the pixel devices 302. In the illustrated example of FIG. 3B, each of the matrix drivers 320 controls a sixteen of the pixel devices (e.g., a corresponding 4×4 submatrix of the pixel devices 302). In other examples, the matrix drivers 320 can control a different number of the pixel devices 302 (e.g., 100, 1,000, etc.) in corresponding regions of the micro-LED display 300. In particular, each of the matrix drivers 320 can control up to 100,000 of the pixel devices 302. In this example, a size of one of the matrix drivers 320 is greater than a size of one of the pixel devices 302 (e.g., more than twice the size of the one of the pixel devices 302).

In contrast to each of the known pixel drivers 116 of FIG. 1 controlling a corresponding one of the known pixel devices 104 of FIG. 1, the matrix drivers 320 of FIG. 3B control multiple ones of the pixel devices 302 of FIGS. 3A and/or 3B by providing electrical signals thereto. In this example, by enabling the matrix drivers 320 to control and/or otherwise drive multiple ones of the micro-LEDs 110 of the pixel devices 302, a number of drivers in the micro-LED display 300 can be reduced, thus reducing parts costs associated therewith. Furthermore, by implementing the matrix drivers 320 on the bottom surface of the pixel devices 302, a surface area of the pixel devices 302 can be reduced compared to a surface area of the known pixel devices 104 of FIG. 1. This, in turn, enables different pixel devices 302 to be positioned closer together, thereby increasing the resolution or pixel density (e.g., the PPI) that can be achieved when compared to the known micro-LED display 100 of FIG. 1.

In the illustrated example of FIG. 3B, the micro-LED display 300 includes example assist driver circuits 330 coupled to the panel 306 outside the active area 304 of the micro-LED display 300. In this example, each of the assist driver circuits 330 is electrically and/or operatively coupled to one or more of the matrix drivers 320 to send control signals thereto. In FIG. 3B, a combination of the assist driver circuits 330 and the corresponding matrix drivers 320 are used to control the micro-LEDs 110 instead of the row drivers 118, the column drivers 120, and the known pixel drivers 116 of FIG. 1. In particular, each of the assist driver circuits 330 can control multiple rows and/or columns of the pixel devices 302, such that the micro-LED display 300 of FIGS. 3A and/or 3B does not require separate drivers to control the individual rows and columns of the pixel devices 302.

Figure 4:
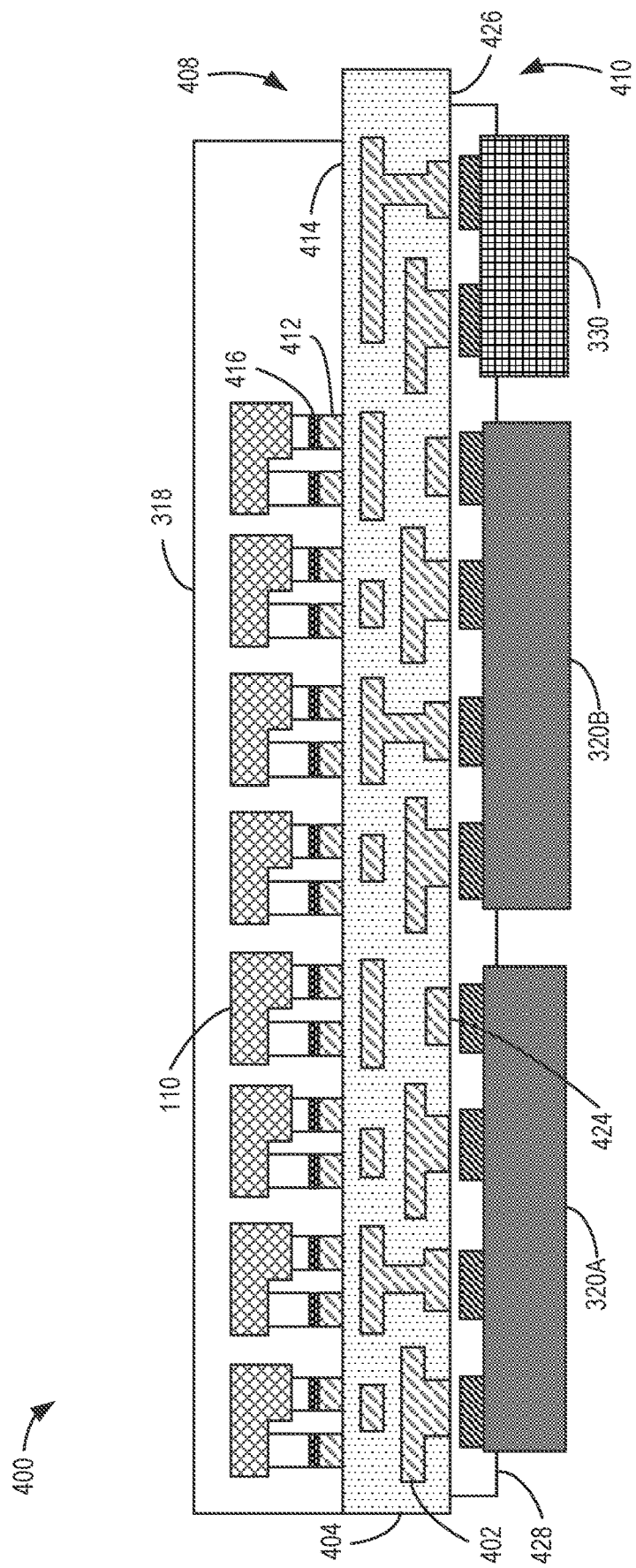
FIG. 4 illustrates a side view of an example micro-LED assembly that can be implemented in the micro-LED display of FIGS. 3A and/or 3B.

FIG. 4 illustrates an example micro-LED assembly 400 in accordance with teachings of this disclosure. In some examples, the micro-LED assembly 400 is used to construct the micro-LED display 300 of FIGS. 3A and/or 3B. For example, the micro-LED assembly 400 electrically couples ones of the micro-LEDs 110, the matrix drivers 320, and/or the assist driver circuits 330 via example conductive paths 402 in an example substrate 404. In some examples, the conductive paths 402 include multiple layers of conductive material (e.g., metal) that define planes or traces of the conductive material that are separated by layers of dielectric material. The conductive material in the separate layers are electrically connected by metal vias extending through the dielectric layers in the substrate 404. In this example, the dielectric material of the substrate 404 includes a polyimide material. In other examples, one or more different materials may be used for the substrate 404 instead. In some examples, a thickness of the substrate 404 is greater than or equal to 2 micrometers (µm) and less than or equal to 50 µm. In this example, the conductive paths 402 extend between a first side 408 and a second side 410 of the substrate 404 to enable flow of electrical signals between the first and second sides 408, 410. For example, the conductive paths 402 include cross-linking paths (e.g., cross-metal signal links) that extend in X and Y directions of a plane of the substrate 404 to electrically couple different locations of the substrate 404 (e.g., to deliver control signals to select ones of the micro-LEDs 110). Additionally or alternatively, the conductive paths 402 can include one or more internal contact paths to couple locations internal to the substrate 404, and/or one or more power metal mesh layers through which power can be supplied to one or more components of the micro-LED assembly 400. In this example, the conductive paths 402 are electrically coupled with first contact pads (e.g., raised contact pads) 412 on a first surface (e.g., a top surface) 414 of the substrate 404. The micro-LEDs 110 are electrically and mechanically coupled to the first contact pads 412 via example bonding material 416 (e.g., solder) deposited on the first contact pads 412. In some examples, an example package resin layer 418 is provided on the first side 408 of the substrate 404 to envelop the micro-LEDs 110 and/or provide protection of the micro-LEDs 110 from external forces and/or damage. In such examples, the package resin layer 418 is a transparent material that passes light therethrough from the micro-LEDs 110. In some examples, a refractive index of the package resin layer 418 provides a refractive index that enables a dispersion of light from the micro-LEDs 110 in multiple directions, thus improving efficiency of light emission from the micro-LEDs 110.

In the illustrated example of FIG. 3, the micro-LED assembly 400 includes the example matrix drivers (e.g., matrix driver circuits, active matrix drivers) 320 on the second side 410 of the substrate 404. In this example, the matrix drivers 320 include a first example matrix driver 320A and a second example matrix driver 320B electrically coupled to example second contact pads 424 on an example second surface (e.g., a bottom surface) 426 on the second side 310 of the substrate 404. For example, the matrix drivers 320 are electrically coupled to the second contacts pads 424 via an example bonding material 428 coupled to the second surface 426. In some examples, the bonding material 428 is an anisotropic conductive film. Additionally or alternatively, in some examples, the matrix drivers 320 are electrically and mechanically coupled directly to the second contact pads 424 via solder. In other examples, one or more different bonding methods to couple the matrix drivers 320 to the second contact pads 424 may be used instead. In some examples, the second contact pads 424 are electrically coupled to the first contact pads 412 and, thus, the micro-LEDs 110, via the conductive paths 402. As such, the conductive paths 402 electrically couple the matrix drivers 320 to corresponding ones of the micro-LEDs 110.

In the illustrated example, one of the example assist driver circuits 330 on the second side 410 of the substrate 404 is electrically coupled to ones of the second contact pads 424 via the bonding material 428. In other examples, the assist driver circuit 330 is electrically and mechanically coupled directly to ones of the second contact pads 424 via a bonding material (e.g., solder). In some examples, ones of the conductive paths 402 are further electrically coupled between different ones of the second contact pads 424 to enable transmission of signals between the assist driver circuit 330 and the matrix drivers 320. For example, first conductive paths (e.g., a first portion of the conductive paths 402) are used to electrically couple the second contact pads 424 to the first contact pads 412, and second conductive paths (e.g., a second portion of the conductive paths 402) are used to electrically couple different ones of the second contact pads 424 to one another. In particular, the second conductive paths of the conductive paths 402 electrically couple first ones of the second contact pads 424 to second ones of the second contact pads 424, where the first ones of the second contact pads 424 are coupled to the matrix drivers 320, and the second ones of the second contact pads 424 are coupled to the assist driver circuit 330. In such examples, first signals (e.g., first electrical signals) may be provided from the matrix drivers 320 to corresponding ones of the micro-LEDs 110 via the first conductive paths to control a frequency and/or intensity of light emitted by the micro-LEDs 110. Furthermore, second signals (e.g., second electrical signals) may be provided from the assist driver circuit 330 to the matrix drivers 320 to selectively activate or deactivate ones of the micro-LEDs 110.

A process of manufacturing the micro-LED assembly 400 of FIG. 4 is described in connection with FIGS. 5-14 below. In particular, FIGS. 5-14 illustrate various stages in the process of manufacturing the micro-LED assembly 400 of FIG. 4.

Figure 5:
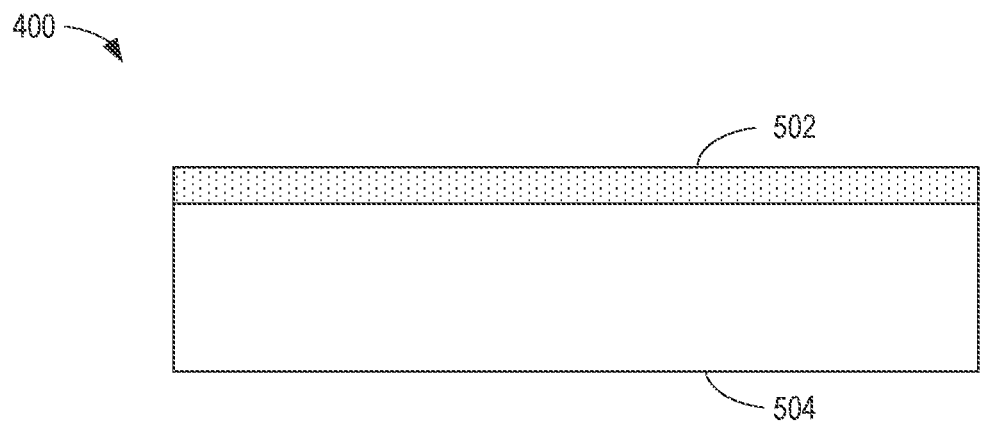
FIG. 5 illustrates an example sacrificial layer coupled to an example glass substrate.

FIG. 5 illustrates an example sacrificial layer 502 coupled to an example glass substrate 504. For example, to manufacture the micro-LED assembly 400 of FIG. 4, the sacrificial layer 502 is deposited on the glass substrate 504. In some such examples, the sacrificial layer 502 is removably coupled to the glass substrate 504. In some examples, the sacrificial layer 502 is a polyimide material. However, one or more different materials may be used for the sacrificial layer 502 instead.

Figure 6:
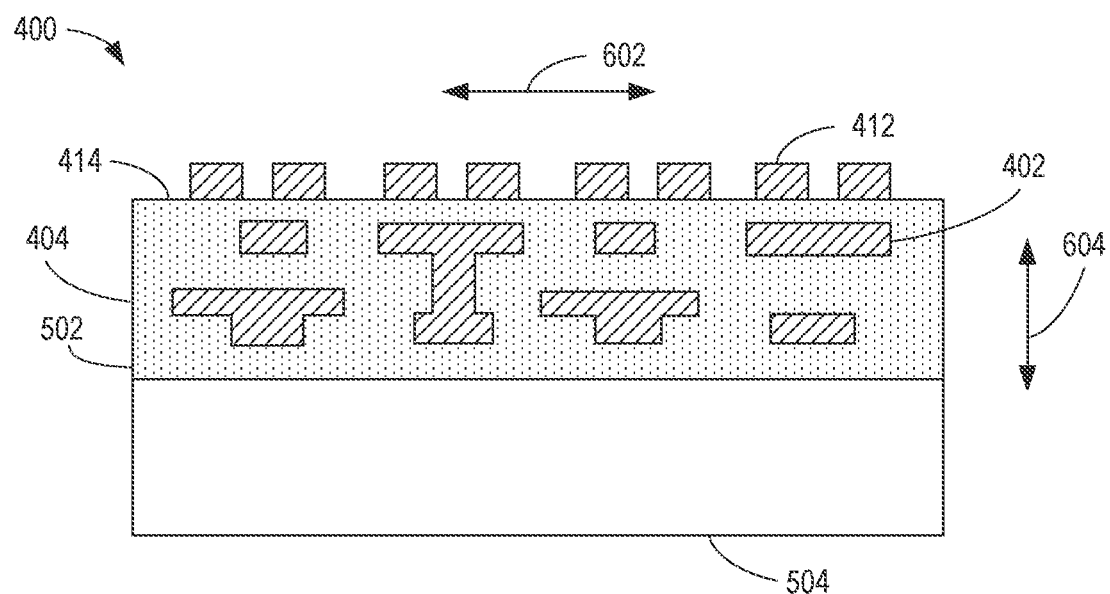
FIG. 6 illustrates an example substrate coupled to the example sacrificial layer of FIG. 5.

FIG. 6 illustrates the example substrate 404 coupled to the sacrificial layer 502 of FIG. 5. For example, the example substrate 404 is deposited on the sacrificial layer 502 by depositing subsequent layers of polyimide material on the sacrificial layer 502. That is, in some examples, the polyimide substrate 404 is an extension of the polyimide sacrificial layer 502. In this example, during production of the substrate 404, the example conductive paths 402 are provided within the substrate 404. For example, conductive material is deposited with the layers of polyimide material to provide the conductive paths 402. In some examples, the conductive paths 402 can extend in an example horizontal direction 602 and/or an example vertical direction 604 through the substrate 404. For example, a first portion of the conductive paths 402 (e.g., first conductive paths) extend in the vertical direction 604 to the first surface 414 of the substrate 404. In this example, the first portion of the conductive paths 402 extend to the first surface 414 and are electrically coupled to the first contact pads 412. In some examples, the first contact pads 412 are integrally provided as part of the conductive paths 402. In this example, the first contact pads 412 protrude from the first surface 414. In other examples, the conductive paths 402 do not protrude from the first surface 414, such that the first contact pads 412 are approximately level with the first surface 414 and/or below the first surface 414. In some examples, a second portion of the conductive paths 402 (e.g., second conductive paths) extend at least partially in the horizontal direction 602 to electrically couple two or more points within the substrate 404.

Figure 7:
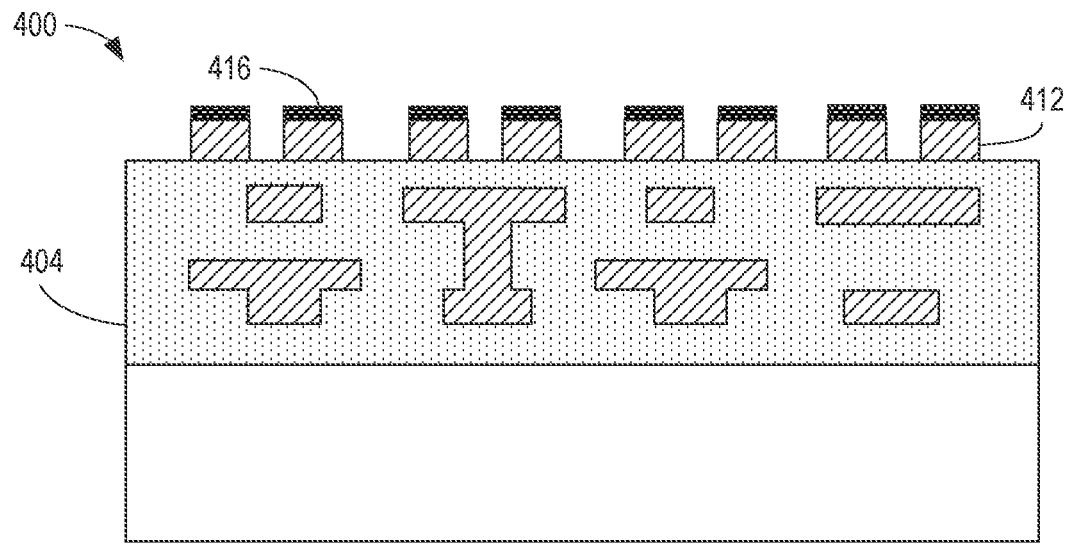
FIG. 7 illustrates example bonding material deposited on first example contact pads of FIG. 6.

FIG. 7 illustrates example bonding material 416 (e.g., solder) deposited on the first contact pads 412 of FIG. 6. For example, to enable coupling of the micro-LEDs 110 of FIGS. 3A and/or 4 to the first contact pads 412, the bonding material 416 is deposited on the first contact pads 412. In some examples, the bonding material 416 can be a conductive material (e.g., solder).

Figure 8:
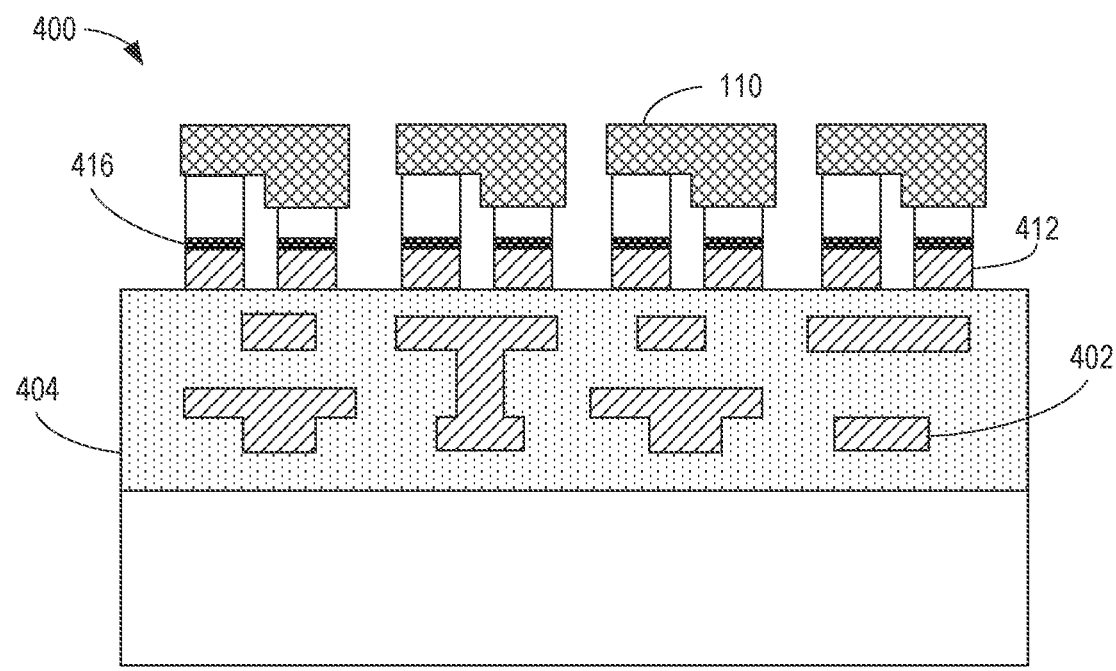
FIG. 8 illustrates example micro-LEDs coupled to the example first contact pads of FIG. 7.

FIG. 8 illustrates the example micro-LEDs 110 coupled to the first contact pads 412. In some examples, the micro-LEDs 110 are aligned with corresponding ones of the first contact pads 412, and pressure and/or heat can be applied to the bonding material 416 to enable bonding of the micro-LEDs 110 to the first contact pads 412. In this example, the bonding material 416 allows flow of electrical signals (e.g., current) therethrough. As such, the bonding material 416 electrically couples the micro-LEDs 110 to the first contact pads 412 and, thus, the conductive paths 402. In this example, each of the micro-LEDs 110 is coupled to at least two of the first contact pads 412. In such examples, a first one of the at least two of the first contact pads 412 is coupled to a cathode of a corresponding one of the micro-LEDs 110, and a second one of the at least two of the first contact pads 412 is coupled to an anode of the corresponding one of the micro-LEDS 110. In some examples, the micro-LEDs 110 are mass transferred onto the substrate 404 and/or the first contact pads 412. For example, multiple ones of the micro-LEDs 110 are constructed together and transferred to the substrate 404 and/or the first contact pads 412 at substantially the same time (e.g., during a single operation) to improve speed and/or efficiency of manufacture of the micro-LED assembly 400.

Figure 9:
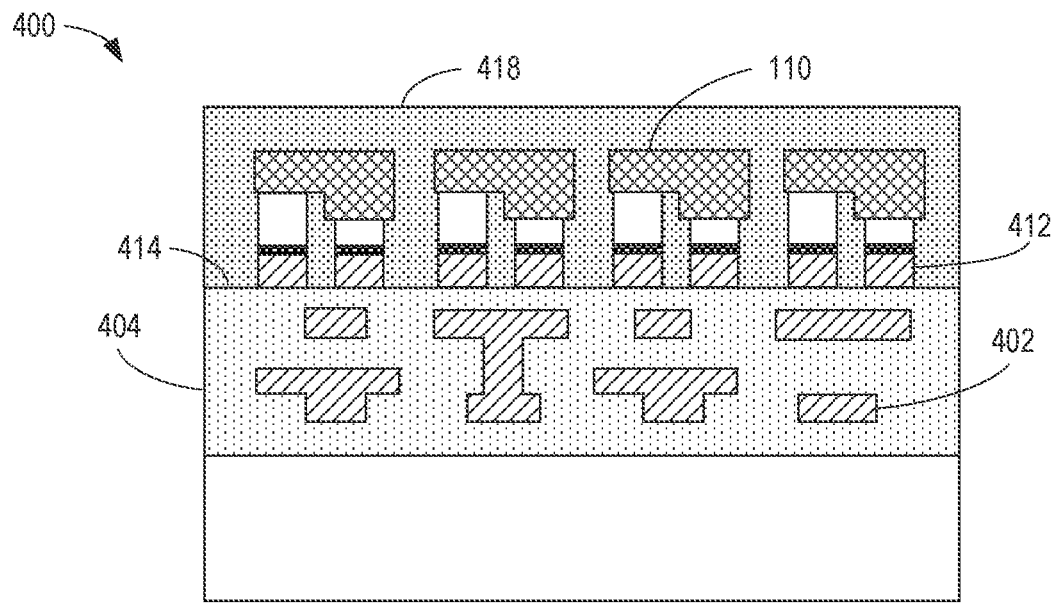
FIG. 9 illustrates an example package resin layer provided on a first surface of the example substrate of FIG. 8.
Figure 10:
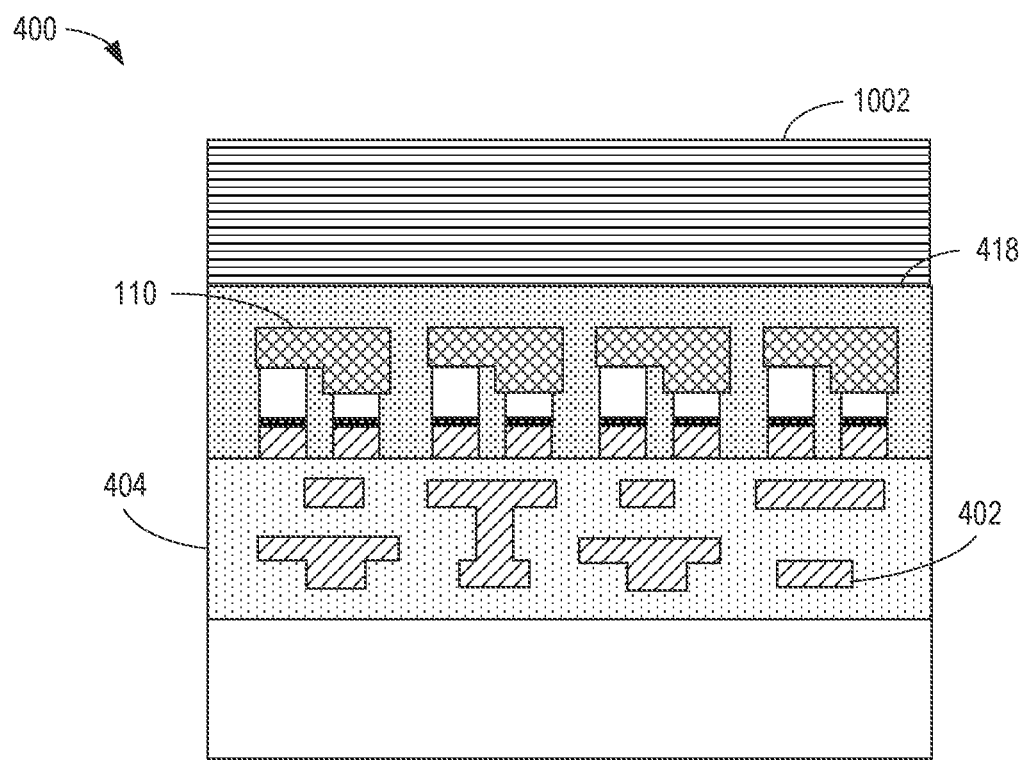
FIG. 10 illustrates an example carrier substrate coupled to the example package resin layer of FIG. 9.

FIG. 9 illustrates an example package resin layer 418 provided on the first surface 412 of the example substrate 404. For example, the package resin layer 418 can include an epoxy resin and/or silicone material. In this example, the package resin layer 418 surrounds and/or otherwise envelops the micro-LEDs 110 to protect the micro-LEDs 110 from contaminants and/or damage. In some examples, the package resin layer 418 is a transparent material that enables light emitted by the micro-LEDs 110 to pass through the package resin layer 418. Furthermore, FIG. 10 illustrates an example carrier substrate 1002 coupled to the package resin layer 418. For example, the carrier substrate 1002 is removably coupled to the package resin layer 418 via an adhesive. In some examples, the carrier substrate 1002 protects the package resin layer 418 during transportation and/or installation of the micro-LED assembly 400. In some examples, the carrier substrate 1002 is glass.

Figure 11:
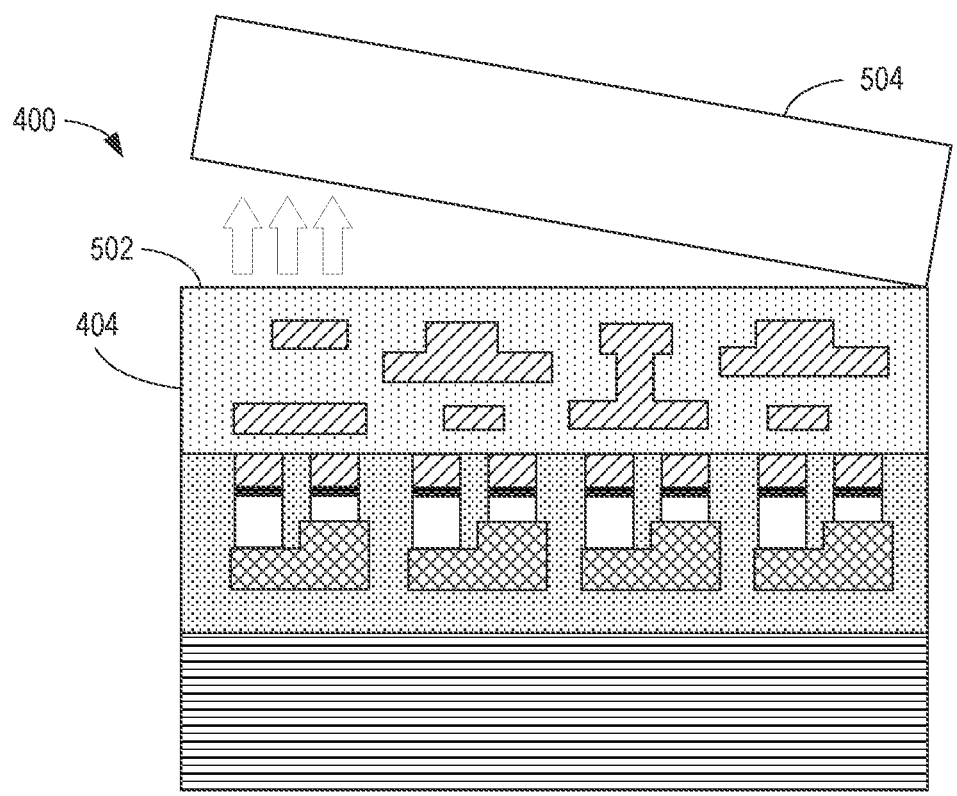
FIG. 11 illustrates the example glass substrate removed from the example substrate of FIG. 10.
Figure 12:
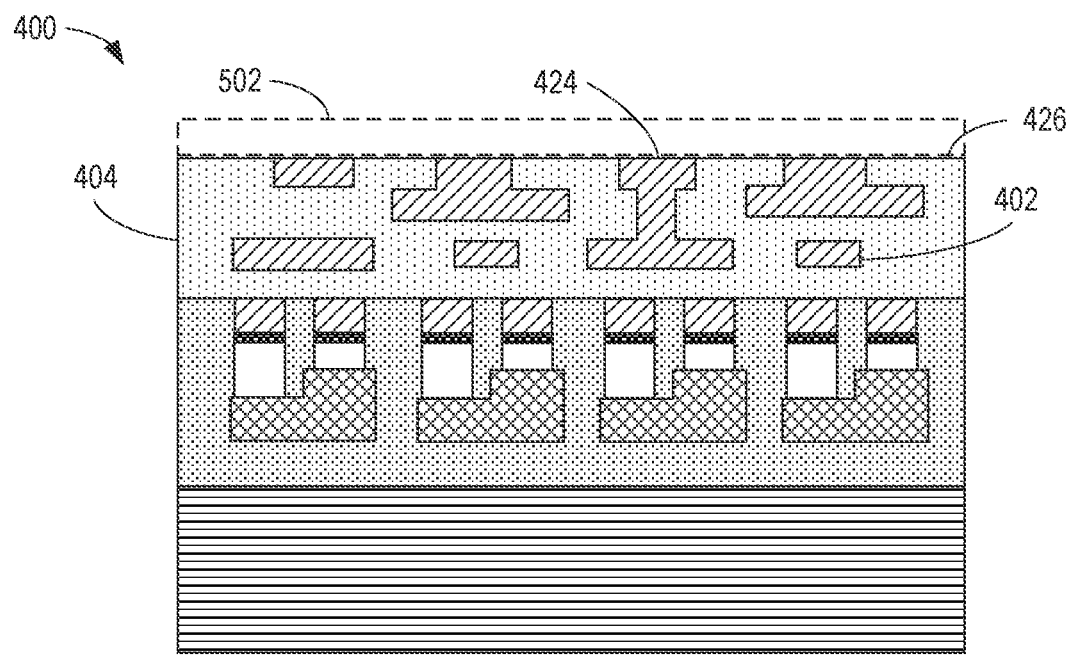
FIG. 12 illustrates removal of the example sacrificial layer from the example substrate of FIG. 11.

Turning to FIG. 11, the example glass substrate 504 is removed from the substrate 404. For example, the glass substrate 504 is lifted off of and/or otherwise removed from the substrate 404 to expose the sacrificial layer 502 of the substrate 404. Furthermore, FIG. 12 illustrates removal of the sacrificial layer 502 from the example substrate 404. In some examples, the sacrificial layer 502 can be removed by etching, polishing, and/or lasering of the sacrificial layer 502 until ends of the conductive paths 402 in the substrate 404 are exposed. In such examples, the exposed ends of the conductive paths 402 provide the second contact pads 424 on the second surface 426 of the substrate 404. In some examples, the second contacts pads 424 are approximately level with the second surface 426. Furthermore, ones of the second contact pads 424 are electrically coupled to the first contact pads 412 via the conductive paths 402 in the substrate 404.

Figure 13:
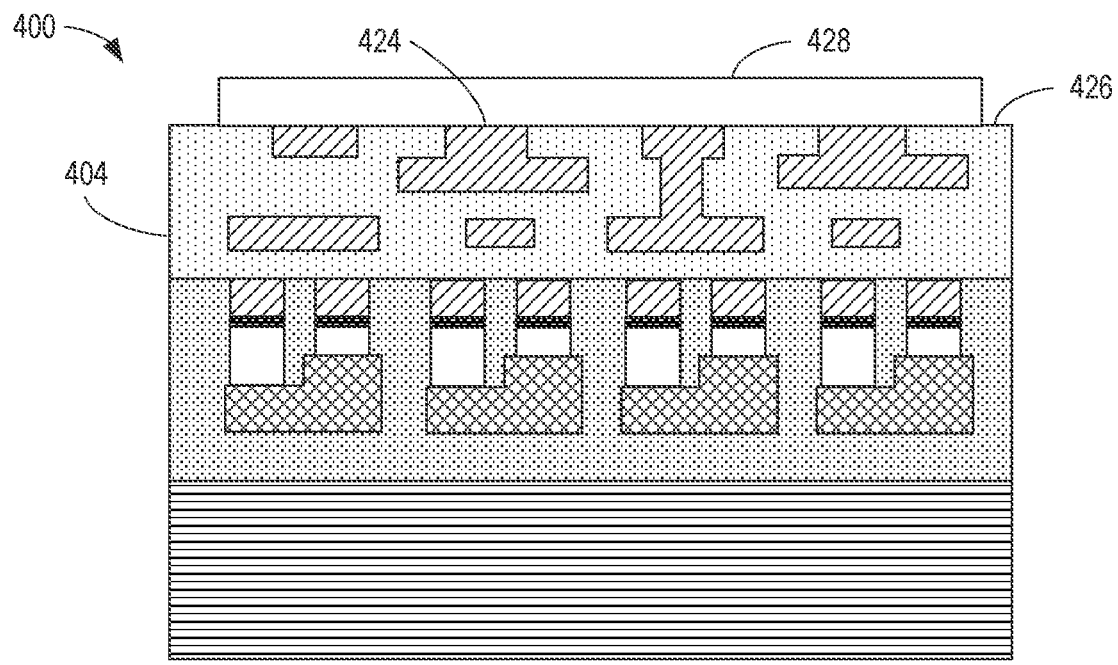
FIG. 13 illustrates example bonding material coupled to a second surface of the example substrate of FIG. 12.

FIG. 13 illustrates the example bonding material 428 coupled to the second surface 426 of the substrate 404. For example, the bonding material 428 is coupled to the second surface 426 and electrically coupled to each of the second contact pads 424 thereupon. In some examples, the bonding material 428 includes an anisotropic conductive film for coupling one or more drivers (e.g., the matrix drivers 320 of FIG. 4) thereto. In some examples, the bonding material 428 provides a substantially smooth and/or flat surface to enable coupling of drivers (e.g., the matrix drivers 320 and/or the assist driver circuits 330) thereto. For example, the bonding material 428 can account for irregularities and/or non-flat surface features of the second surface 426 created during etching, polishing, and/or lasering of the substrate 404.

Figure 14:
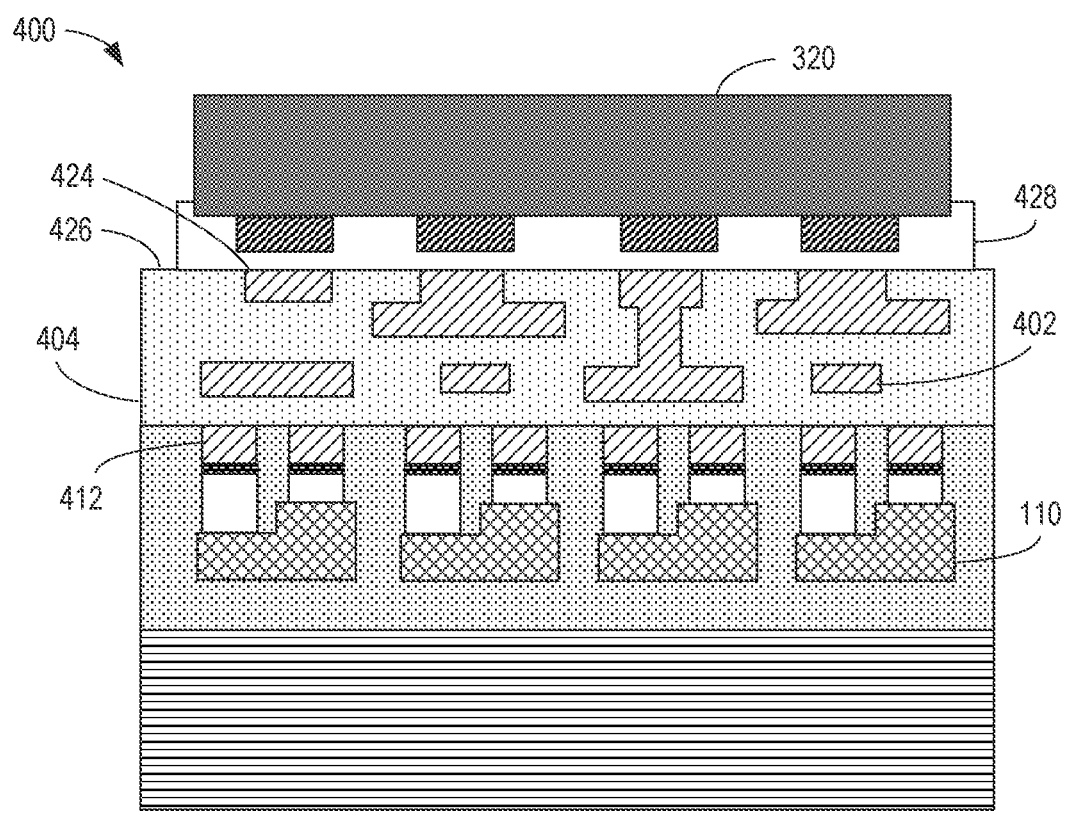
FIG. 14 illustrates a first example matrix driver coupled to the example bonding material of FIG. 13.

FIG. 14 illustrates the example first matrix driver 320 coupled to the example bonding material 428. In such examples, the matrix driver 320 is electrically coupled to ones of the second contacts pads 424 via the bonding material 428. Accordingly, the matrix driver 320 is further electrically coupled to the conductive paths 402, the first contact pads 412, and, thus, the micro-LEDs 110. In some examples, the matrix driver 320 can independently control the micro-LEDs 110 by providing electrical signals thereto via corresponding ones of the conductive paths 402. In this example, the matrix driver 320 is a standalone IC chip that is separately fabricated using any suitable semiconductor fabrication processes before being transferred to the substrate 404 as shown in FIG. 14. In examples disclosed herein, multiple ones of the matrix drivers 320 can be transferred to the substrate 404 via the bonding material 428 at substantially the same time (e.g., during a single operation) to improve a speed and/or efficiency of manufacturing the micro-LED assembly 400.

Figure 15:
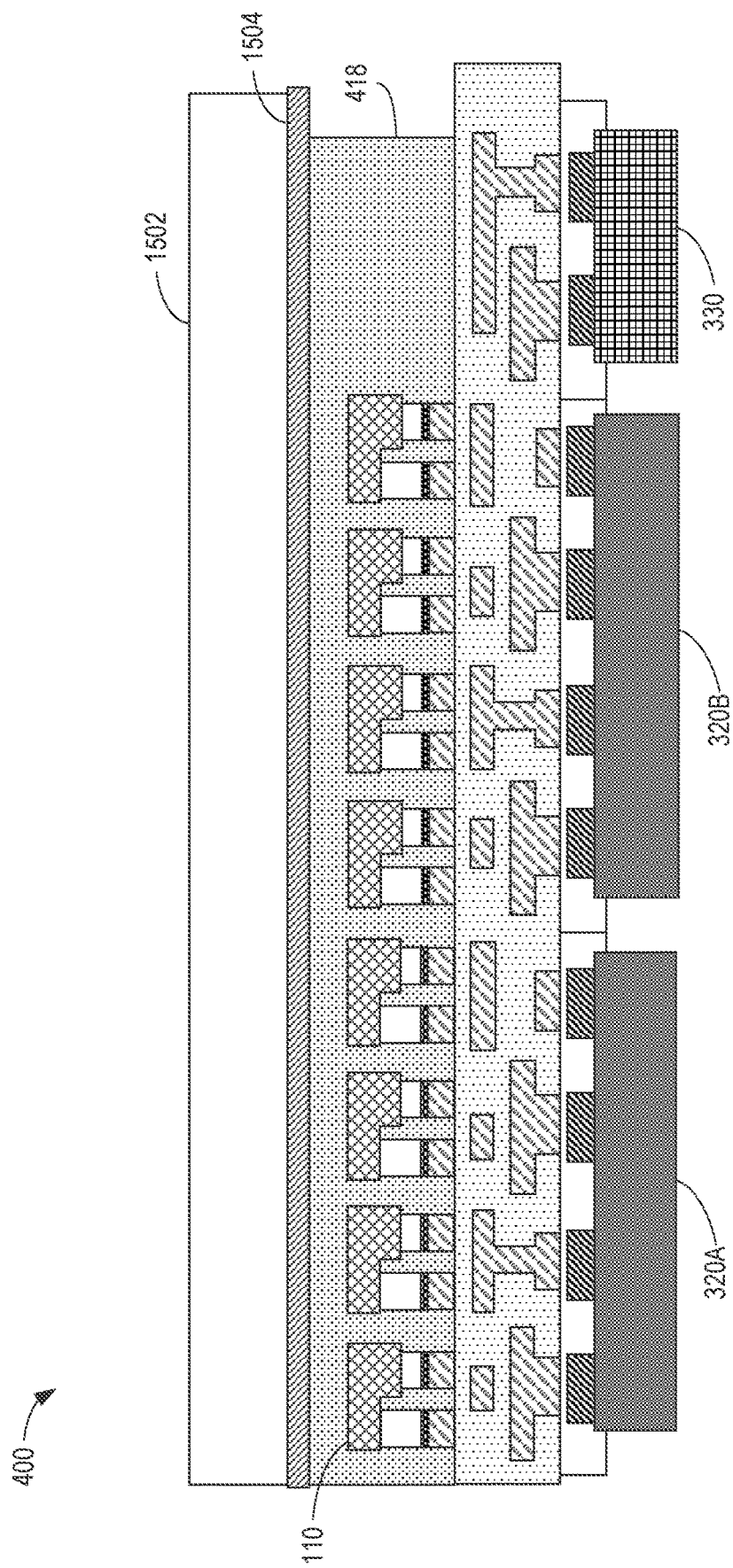
FIG. 15 illustrates the example micro-LED assembly of FIG. 3 including an example cover glass coupled thereto.

FIG. 15 illustrates the example micro-LED assembly 400 of FIG. 4 including an example cover glass 1502 coupled thereto. In some examples, the cover glass 1502 corresponds to the carrier substrate 1002 of FIG. 10. In other examples, the carrier substrate 1002 is removed during installation of the micro-LED assembly 400 in the panel 306 of FIGS. 3A and/or 3B, and the cover glass 1502 is coupled to the package resin layer 418 via an example adhesive layer 1504. In some examples, the cover glass 1502 protects the package resin layer 418 and/or the micro-LEDs 110 from damage during construction, installation, and/or use of the micro-LED display 100 of FIG. 1.

Figure 16:
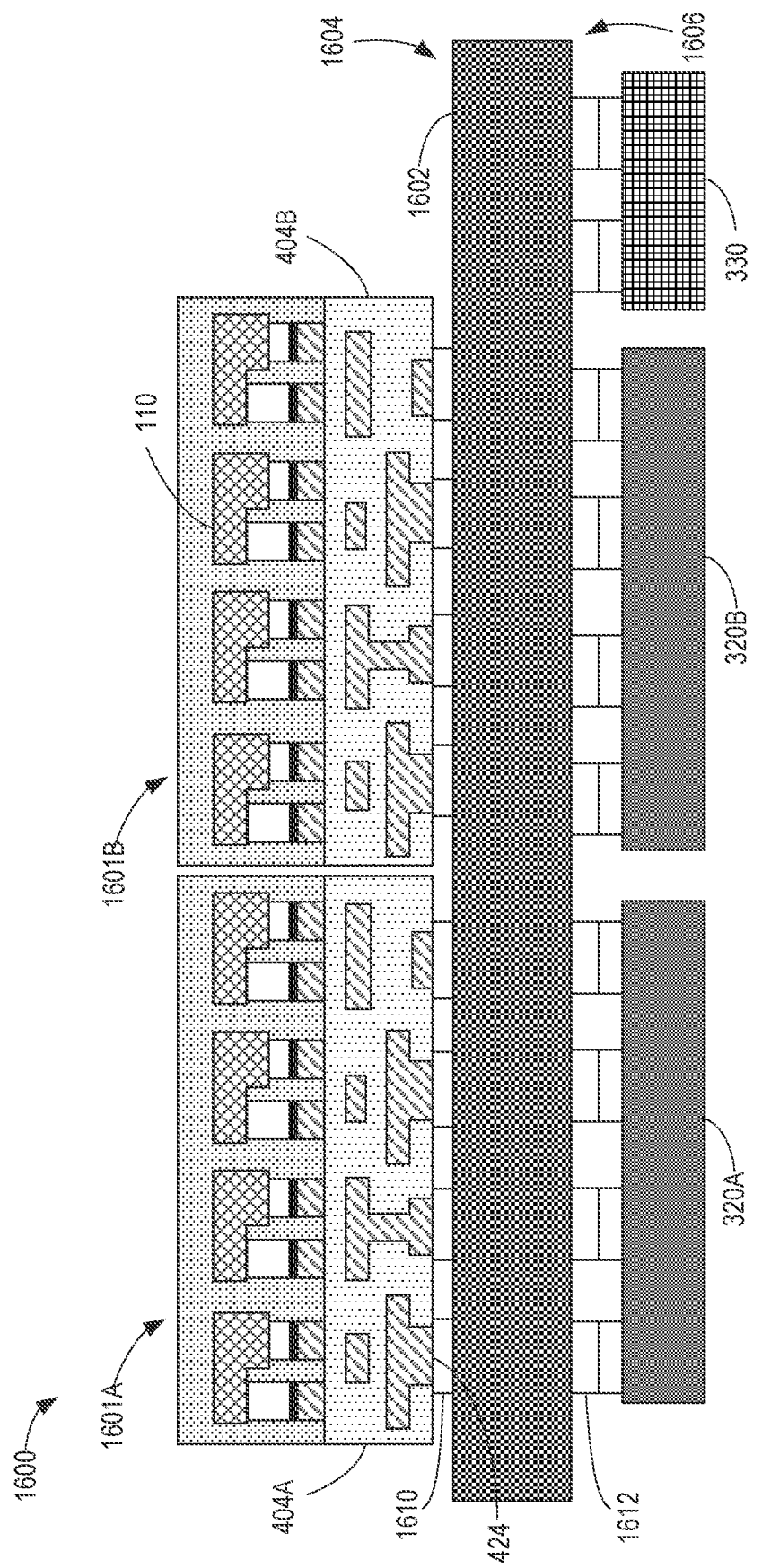
FIG. 16 illustrates a second example micro-LED assembly that can be implemented in an example micro-LED display in addition to or instead of the example micro-LED assembly of FIG. 3.

FIG. 16 illustrates a second example micro-LED assembly 1600 that can be implemented in the micro-LED display 300 of FIGS. 3A and/or 3B in addition to or instead of the micro-LED assembly 400 of FIG. 4. In the illustrated example of FIG. 16, a first example micro-LED matrix tile 1601A is electrically coupled to the first matrix driver 320A, and a second example micro-LED matrix tile 1601B is electrically coupled to the second matrix driver 322. In this example, the first micro-LED matrix tile 1601A includes a first example substrate 404A and a first portion of the micro-LEDs 110, and the second micro-LED matrix tile 1601B includes the second substrate 404B and a second portion of the micro-LEDs 110. In this example, the first micro-LED matrix tile 1601A is separate from the second micro-LED matrix tile 1601B. In some examples, the separate micro-LED matrix tiles 1601A, 1602B are discrete unitary assemblies that are separately manufactured before being combined or assembled with the other components of the second micro-LED assembly 1600. However, in other examples, the first and second substrates 304A, 304B can be a unitary substrate (e.g., the substrate 404 of FIG. 4).

In the illustrated example of FIG. 16, the second micro-LED assembly 1600 includes an example printed circuit board (PCB) 1602 coupled between the micro-LED matrix tiles 1601A, 1601B and the corresponding matrix drivers 320A, 320B. In this example, the micro-LED matrix tiles 1601A, 1601B are coupled to a first example side 1604 of the PCB 1602 and the matrix drivers 320, 322 and the assist driver circuit 330 are coupled to a second example side 1606 of the PCB 1602. For example, the PCB 1602 includes third example contact pads 1610 on the first side 1604 of the PCB 1602, where the third contact pads 1610 are coupled to corresponding ones of the second contact pads 424 on the substrates 404A, 404B. Furthermore, the PCB 1602 includes fourth example contact pads 1612 on the second side 1606 of the PCB 1602, where the fourth contact pads 1612 are coupled to corresponding ones of the matrix drivers 320 and/or the assist driver circuit 330.

In this example, ones of the fourth contact pads 1612 are electrically coupled to the third contact pads 1610 and/or to one another via conductive traces and/or interconnects in the PCB 1602 to allow transmission of signals therebetween. As such, the PCB 1602 electrically couples the matrix drivers 320 to corresponding ones of the micro-LED matrix tiles 1601A, 1601B, and further electrically couples the matrix drivers 320 to the assist driver circuit 330. In some examples, the micro-LED matrix tiles 1601A, 1601B are independently manufactured and mounted to the PCB 1602 (e.g., separately from the matrix drivers 320 and/or the assist driver circuits 330). As such, the micro-LED matrix tiles 1601A, 1601B can be mounted to the PCB 1602 prior to or after the mounting of the matrix drivers 320 and/or the assist driver circuits 330. Furthermore, while two of the micro-LED matrix tiles 1601A, 1601B are shown in this example, a different number and/or arrangement of the micro-LED matrix tiles 1601A, 1601B may be used instead.

Figure 17:
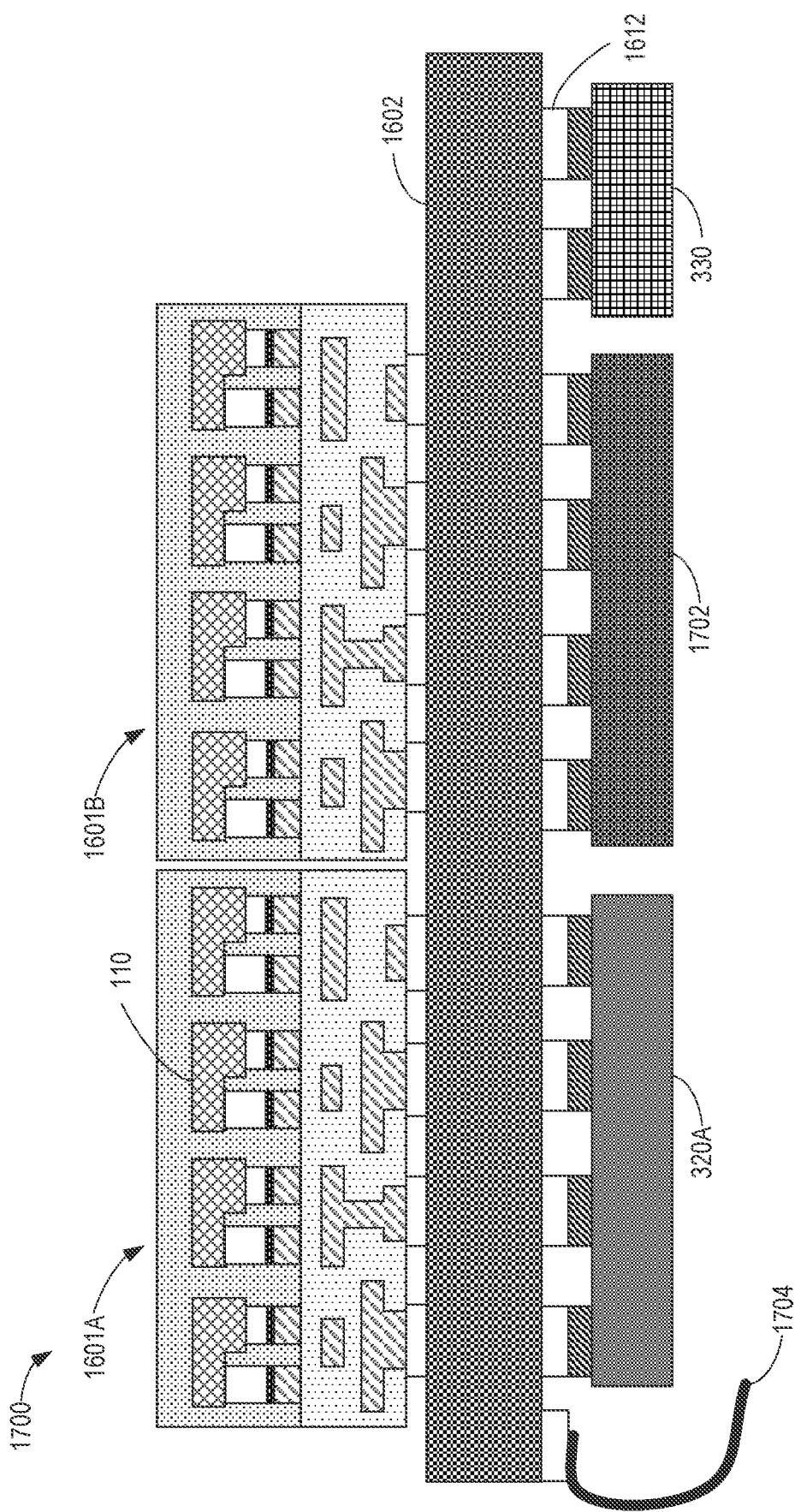
FIG. 17 illustrates a third example micro-LED assembly that can be implemented in an example micro-LED display in addition to or instead of the micro-LED assembly of FIG. 3 and/or the second micro-LED assembly of FIG. 16.

FIG. 17 illustrates a third example micro-LED assembly 1700 that can be implemented in the micro-LED display 300 of FIGS. 3A and/or 3B in addition to or instead of the micro-LED assembly 400 of FIG. 3 and/or the second micro-LED assembly 1600 of FIG. 16. In the illustrated example of FIG. 17, a structure of the third micro-LED assembly 1700 is similar to a structure of the second micro-LED assembly 1600 of FIG. 16. However, unlike the second micro-LED assembly 1600 of FIG. 16, the third micro-LED assembly 1700 of FIG. 17 does not include the second matrix driver 320B. Instead, the third example micro-LED assembly 1700 of FIG. 17 includes an example timing controller 1702 coupled to ones of the fourth contact pads 1612 of the PCB 1602. In this example, the timing controller 1702 is electrically and/or operatively coupled to the first matrix driver 320A and/or the assist driver circuit 330 to control a timing and/or frequency of signals transmitted to and/or from the first matrix driver 320A and/or the assist driver circuit 330. In this example, the first matrix driver 320A is electrically coupled to each of the micro-LED matrix tiles 1601A, 1601B to independently control the micro-LEDs 110 thereof. In the illustrated example of FIG. 17, an example connector (e.g., a system connector) 1704 is coupled to one of the fourth contact pads 1612. In some examples, the connector 1704 is electrically couplable to a power source of the micro-LED display 300 of FIGS. 3A and/or 3B.

Figure 18:
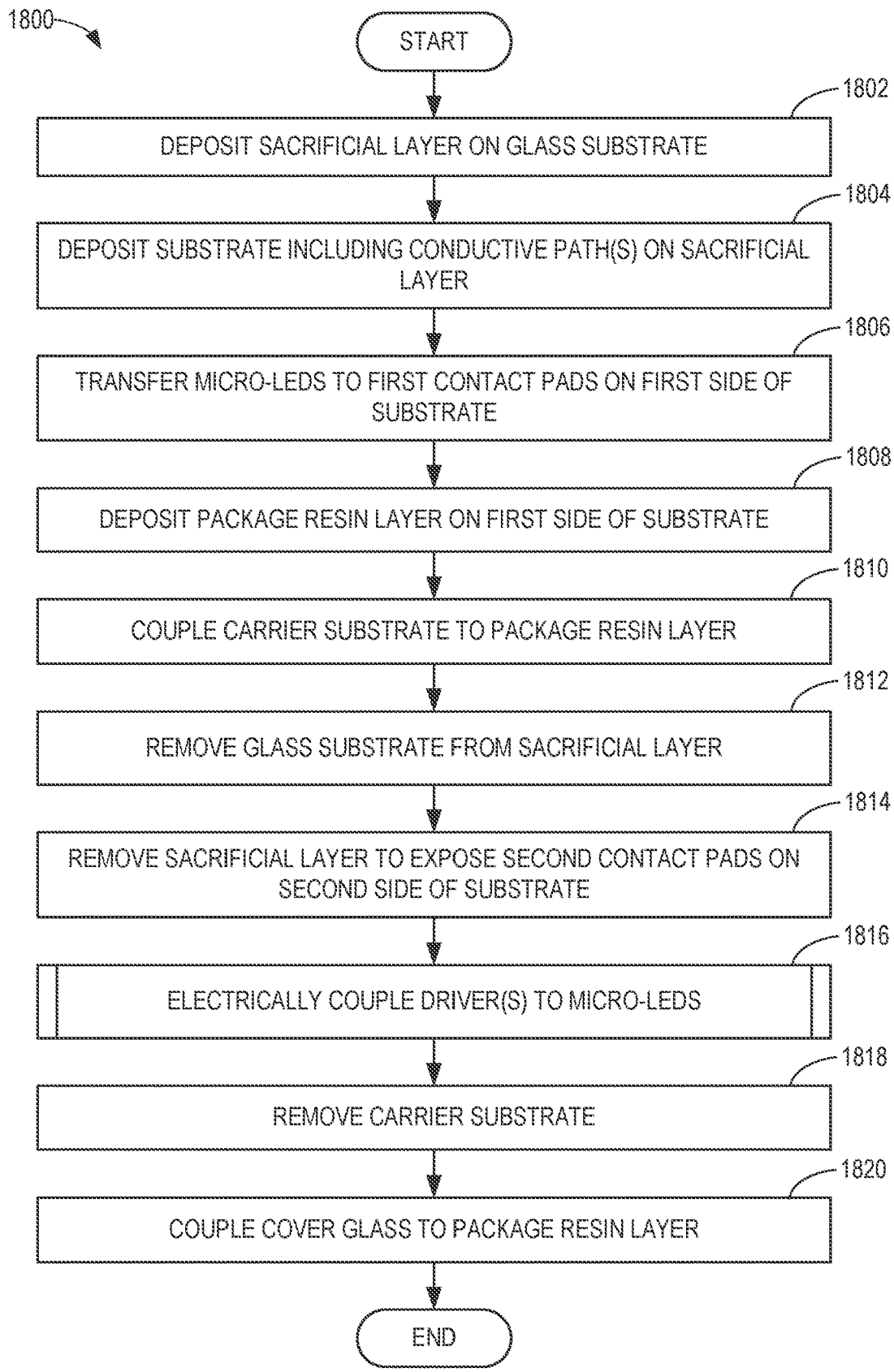
FIG. 18 is a flowchart representative of an example method of manufacturing the example micro-LED assembly of FIGS. 3 and/or 15, the second example micro-LED assembly of FIG. 16, and/or the third example micro-LED assembly of FIG. 17.

FIG. 18 is a flowchart representative of an example method 1800 of manufacturing the example micro-LED assembly 400 of FIGS. 3 and/or 15, the second example micro-LED assembly 1600 of FIG. 16, and/or the third example micro-LED assembly 1700 of FIG. 17. In some examples, some or all of the operations outlined in the example method 1800 are performed automatically by fabrication equipment that is programmed to perform the operations. Although the example method of manufacturing is described with reference to the flowchart illustrated in FIG. 18, many other methods may alternatively be used. For example, the order of execution of the blocks may be changed, and/or some of the blocks described may be combined, divided, re-arranged, omitted, eliminated, and/or implemented in any other way.

The example method 1800 of FIG. 18 begins at block 1802 by depositing the example sacrificial layer 502 on the example glass substrate 504 of FIG. 5. For example, the sacrificial layer 502 is fabricated on the glass substrate 504 by depositing subsequent layers of polyimide material thereupon.

At block 1804, the example method 1800 includes depositing the example substrate 404 including the conductive paths 402 on the sacrificial layer 502. For example, the substrate 404 and the conductive paths 402 are fabricated by depositing layers of polyimide material and/or conductive material on the sacrificial layer 502, where the conductive material corresponds to the conductive paths 402 in the substrate 404. In some examples, additional conductive material is deposited on ends of the conductive paths 402 such that the conductive material protrudes from the first surface 312 of the substrate 404 to provide the first contact pads 412.

At block 1806, the example method 1800 includes transferring the micro-LEDs 110 to the first contact pads 412 of the first side 308 of the substrate 404. For example, the bonding material 416 is deposited and/or fabricated on the first contact pads 412, and the micro-LEDs 110 are positioned on corresponding ones of the first contact pads 412. In some examples, pressure and/or heat is applied to the micro-LEDs 110 and/or the bonding material 416 to bond and/or otherwise electrically couple the micro-LEDs 110 to the first contact pads 412. In some examples, multiple ones of the micro-LEDs 110 are transferred (e.g., mass transferred) to the first side 308 of the substrate 404 at substantially the same time.

At block 1808, the example method 1800 includes depositing the package resin layer 418 on the first side 308 of the substrate 404. For example, the package resin layer 418 is deposited on the first surface 312 of the substrate 404 to surround and/or otherwise envelop the micro-LEDs 110. In some examples, the package resin layer 418 is a transparent material, including an epoxy and/or a silicone material.

At block 1810, the example method 1800 includes coupling the carrier substrate 1002 to the package resin layer 418. For example, the carrier substrate 1002 is coupled, via an adhesive, to the package resin layer 418 to protect and/or provide support to the micro-LED assembly 400, the second micro-LED assembly 1600, and/or the third micro-LED assembly 1700 during transportation and/or installation thereof.

At block 1812, the example method 1800 includes removing the glass substrate 504 from the sacrificial layer 502. For example, the glass substrate 504 is lifted off of and/or otherwise removed from the sacrificial layer 502 to expose a surface of the sacrificial layer 502.

At block 1814, the example method 1800 includes removing the sacrificial layer 502 from the substrate 404 to expose the second contact pads 424 on the second side 310 of the substrate 404. For example, the sacrificial layer 502 is removed by etching, polishing, and/or lasering layers of the polyimide material of the sacrificial layer 502 until the second contact pads 424 are exposed.

At block 1816, the example method 1800 includes electrically coupling at least one of the matrix drivers 320 to the micro-LEDs 110. Electrical coupling of the matrix drivers 320 to the micro-LEDs 110 is disclosed further in detail below in connection with FIGS. 19 and/or 20.

At block 1818, the example method 1800 includes removing the carrier substrate 1002 from the package resin layer 418. For example, the carrier substrate 1002 may be lifted off and/or otherwise removed during installation of the micro-LED assembly 400, the second micro-LED assembly 1600, and/or the third micro-LED assembly 1700 in the micro-LED display 300 of FIGS. 3A and/or 3B.

At block 1820, the example method 1800 includes coupling the cover glass 1502 to the package resin layer 418. For example, the cover glass 1502 is coupled to the package resin layer 418 via the adhesive layer 1504. In some examples, instead of coupling the cover glass 1502 to the package resin layer 418, the carrier substrate 1002 is not removed at block 1818 and the carrier substrate 1002 serves to protect and/or provide support to the micro-LED assembly 400, the second micro-LED assembly 1600, and/or the third micro-LED assembly 1700 instead of the cover glass 1502.

Figure 19:
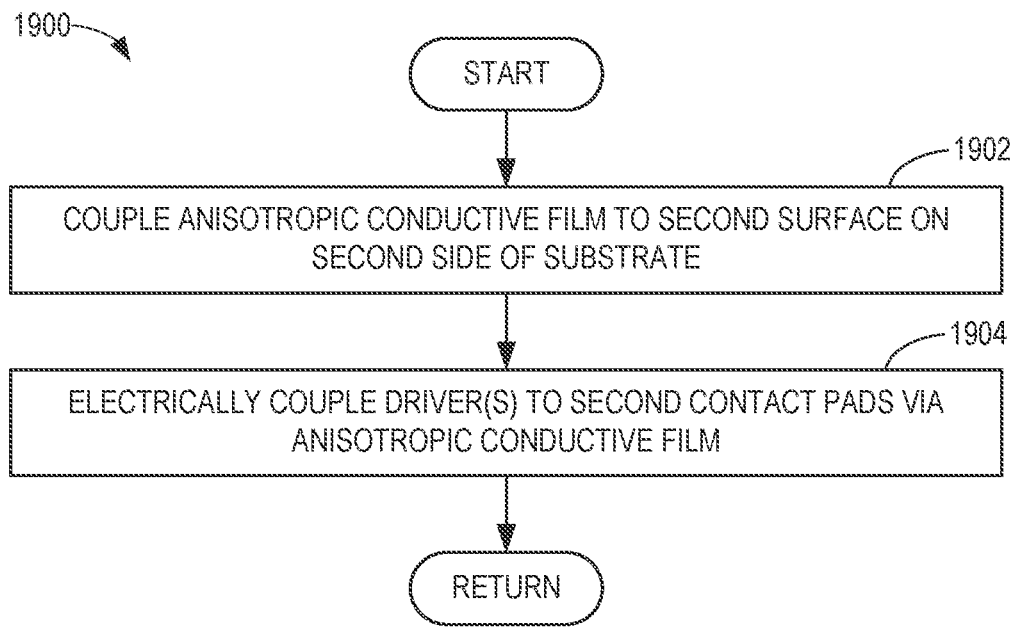
FIG. 19 is a flowchart representative of a first example method of electrically coupling one or more driver circuits to the example micro-LEDs in connection with block 1816 of FIG. 18.

FIG. 19 is a flowchart representative of a first example method 1900 of electrically coupling at least one of the matrix drivers 320 to the example micro-LEDs 110 in connection with block 1816 of FIG. 16. In some examples, the first method 1900 of FIG. 19 is performed to manufacture the example micro-LED assembly 400 of FIG. 3.

The first example method 1900 begins at block 1902 by coupling the bonding material 428 to the second surface 426 on the second side 310 of the substrate 404. For example, the bonding material 428 is coupled to the second surface 426 and electrically coupled to the second contact pads 424 thereupon. In some examples, the bonding material 428 provides a substantially smooth and/or flat surface to enable coupling of drivers (e.g., the matrix drivers 320 and/or the assist driver circuits 330) thereto. For example, the bonding material 428 can account for irregularities and/or non-flat surface features of the second surface 426 created during etching, polishing, and/or lasering of the substrate 404.

At block 1904, the first example method 1900 includes electrically coupling at least one of the matrix drivers 320 to the second contact pads 424 via the bonding material 428. In such examples, the matrix driver(s) 320 is/are electrically coupled, via the bonding material 428 and the conductive paths 402, to corresponding ones of the micro-LEDs 110 to control operation thereof. For example, the matrix driver(s) 320 can provide electrical signals to the micro-LEDs 110 to turn the micro-LEDs 110 on or off and/or vary a brightness thereof. In some examples, the micro-LED assembly 400 does not include the bonding material 428, and the matrix driver(s) 320 is/are instead directly coupled to the second contact pads 424.

Figure 20:
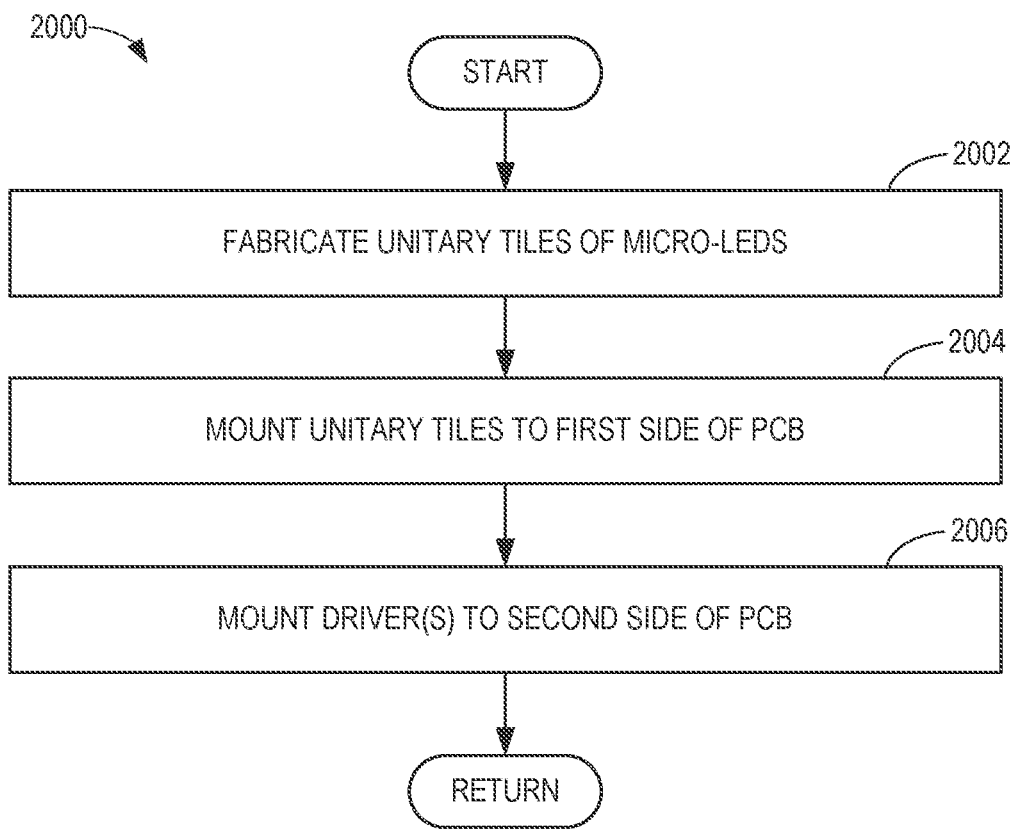
FIG. 20 is a flowchart representative of a second example method of electrically coupling one or more driver circuits to the example micro-LEDs in connection with block 1816 of FIG. 18.

FIG. 20 is a flowchart representative of a second example method 2000 of electrically coupling the matrix driver(s) 320 to the example micro-LEDs 110 in connection with block 1816 of FIG. 16. In some examples, the method 2000 of FIG. 20 is performed to manufacture the second example micro-LED assembly 1600 of FIG. 16 and/or the third example micro-LED assembly 1700 of FIG. 17.

The second example method 2000 begins at block 2002 by fabricating unitary tiles of the example micro-LEDs 110. For example, the first micro-LED matrix tile 1601A of FIG. 16 is fabricated to include a first portion of the micro-LEDs 110, and the second micro-LED matrix tiles 1601B of FIG. 16 is fabricated to include a second portion of the micro-LEDs 110.

At block 2004, the second example method 2000 includes mounting the unitary tiles to the first side 1604 of the PCB 1602. For example, the unitary tiles (e.g., the micro-LED matrix tiles 1601A, 1601B) are electrically coupled to the third contact pads 1610 of the PCB 1602. In such examples, the third contact pads 1610 are further electrically coupled to the second contact pads 424 of the unitary tiles 1601A, 1601B to electrically couple the PCB 1602 to the conductive paths 402 and, thus, to the micro-LEDs 110.

At block 2006, the second example method 2000 includes mounting one or more drivers to the second side 1606 of the PCB 1602. For example, the matrix driver(s) 320, the assist driver circuit 330, and/or the timing controller 1702 is/are electrically coupled to the fourth contact pads 1612 on the second side 1606 of the PCB 1602. In such examples, the PCB 1602 electrically couples the matrix driver(s) 320 to the micro-LEDs 110, and/or couples the matrix driver(s) 320 to the assist driver circuit 330 and/or the timing controller 1702.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and/or things, the phrase "at least one of A and B" is intended to refer to implementations including any of (1) at least one A, (2) at least one B, or (3) at least one A and at least one B. Similarly, as used herein in the context of describing structures, components, items, objects and/or things, the phrase "at least one of A or B" is intended to refer to implementations including any of (1) at least one A, (2) at least one B, or (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, or (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, or (3) at least one A and at least one B.

As used herein, singular references (e.g., "a", "an", "first", "second", etc.) do not exclude a plurality. The term "a" or "an" object, as used herein, refers to one or more of that object. The terms "a" (or "an"), "one or more", and "at least one" are used interchangeably herein. Furthermore, although individually listed, a plurality of means, elements or method actions may be implemented by, e.g., the same entity or object. Additionally, although individual features may be included in different examples or claims, these may possibly be combined, and the inclusion in different examples or claims does not imply that a combination of features is not feasible and/or advantageous.

From the foregoing, it will be appreciated that example systems, methods, apparatus, and articles of manufacture for a micro-LED display are disclosed. Disclosed systems, methods, apparatus, and articles of manufacture provide a micro-LED matrix of micro-LEDs on a first side (e.g., a top surface) of a substrate, and one or more drivers to control the micro-LEDs on a second side (e.g., a bottom surface) of the substrate opposite the first side. The example substrate includes example conductive paths that enable transmission of control signals from the driver(s) to the micro-LEDs, such that the driver(s) can control multiple pixel elements of the micro-LED display. Advantageously, by removing the driver(s) from the top surface of the substrate, disclosed systems, methods, apparatus, and articles of manufacture enable a reduction in pixel pitch of the micro-LED display and, thus, improve a resolution of the micro-LED display. Furthermore, disclosed systems, methods, apparatus, and articles of manufacture reduce manufacturing and/or parts costs by reducing a number of the driver(s) to be implemented on the micro-LED display. The disclosed systems, methods, apparatus, and articles of manufacture are accordingly directed to one or more improvement(s) in the operation of a machine such as a computer or other electronic and/or mechanical device.

Example apparatus, methods, and articles of manufacture for a micro-LED display are disclosed herein. Further examples and combinations thereof include the following:

Example 1 includes an apparatus for a micro-LED display, the apparatus comprising a substrate, a micro-LED matrix on a first side of the substrate, a driver circuit on a second side of the substrate, the second side opposite the first side, and a conductive path in the substrate to extend between the first side and the second side to electrically couple the micro-LED matrix to the driver circuit.

Example 2 includes the apparatus of example 1, wherein the substrate is a polyimide substrate.

Example 3 includes the apparatus of example 1, wherein the conductive path is a first conductive path and the driver circuit is a matrix driver circuit, further including at least one of an assist driver circuit or a timing controller on the second side of the substrate, and a second conductive path in the substrate to electrically couple the at least one of the assist driver circuit or the timing controller to the matrix driver circuit.

Example 4 includes the apparatus of example 1, wherein the driver circuit is to control a plurality of pixels of the micro-LED display.

Example 5 includes the apparatus of example 1, further including a package resin layer to envelop the micro-LED matrix.

Example 6 includes the apparatus of example 1, wherein the driver circuit is a first matrix driver circuit to control operation of first LEDs in the micro-LED matrix, further including a second matrix driver circuit on the second side of the substrate, the second matrix driver circuit to control operation of second LEDs in the micro-LED matrix.

Example 7 includes the apparatus of example 1, wherein the substrate is a first substrate, further including a second substrate coupled to the second side of the first substrate, the second side of the first substrate facing a third side of the second substrate, the driver circuit coupled to a fourth side of the second substrate opposite the third side, the second substrate to electrically couple the driver circuit to micro-LEDs of the micro-LED matrix.

Example 8 includes the apparatus of example 7, wherein the first substrate is a polyimide substrate and the second substrate is a printed circuit board.

Example 9 includes the apparatus of example 7, wherein the micro-LED matrix is a first micro-LED matrix, further including a second micro-LED matrix coupled to a third substrate on the third side of the second substrate.

Example 10 includes the apparatus of example 9, wherein the driver circuit is a first matrix driver circuit and the micro-LEDs are first micro-LEDs, further including a second matrix driver circuit on the fourth side of the second substrate, the second substrate to electrically couple the second matrix driver circuit to second micro-LEDs of the second micro-LED matrix.

Example 11 includes an apparatus, comprising an array of micro-LEDs, an IC chip to drive the micro-LEDs in the array of micro-LEDs, and a substrate disposed between the array of micro-LEDs and the IC chip, the substrate to electrically couple the array of micro-LEDs and the IC chip.

Example 12 includes the apparatus of example 11, further including a conductive path in the substrate, the conductive path coupled between a first contact pad on a first side of the substrate and a second contact pad on a second side of the substrate.

Example 13 includes the apparatus of example 12, wherein the first contact pad protrudes from a first surface of the substrate and the second contact pad is substantially level with a second surface of the substrate.

Example 14 includes the apparatus of example 11, wherein the IC chip is a first IC chip and the array of micro-LEDs is a first array of micro-LEDs, further including a second IC chip to drive micro-LEDs in a second array of micro-LEDs, the substrate disposed between the second array of micro-LEDs and the second IC chip.

Example 15 includes the apparatus of example 14, wherein the substrate is a first substrate, further including a second substrate disposed between the first array of micro-LEDs and the first substrate, and a third substrate disposed between the second array of micro-LEDs and the first substrate.

Example 16 includes the apparatus of example 15, wherein the first substrate is a printed circuit board and the second and third substrates include a polyimide material.

Example 17 includes a method to manufacture a micro-LED display, the method comprising providing a substrate that includes a conductive path, the conductive path electrically coupled between a first contact pad on a first side of the substrate and a second contact pad on a second side of the substrate, the first side opposite the second side, electrically coupling micro-LEDs of a micro-LED matrix to the first contact pads, and electrically coupling a driver circuit to the second contact pad, the conductive path to electrically couple the micro-LEDs to the driver circuit.

Example 18 includes the method of example 17, wherein the providing of the substrate includes depositing layers of polyimide material and conductive material on a sacrificial layer of the polyimide material, the conductive material defining the conductive path, and removing the sacrificial layer to expose the second contact pad on the second side of the substrate.

Example 19 includes the method of example 18, wherein the removing of the sacrificial layer includes at least one of etching, polishing, or laser removal.

Example 20 includes the method of example 18, wherein the providing of the substrate includes depositing the sacrificial layer on a glass substrate, and removing the glass substrate from the sacrificial layer prior to the removing of the sacrificial layer.

Example 21 includes the method of example 17, further including coupling a printed circuit board between the substrate and the driver circuit.

Example 22 includes the method of example 17, further including depositing a package resin layer on the first side of the substrate, the package resin layer to envelop the micro-LEDs.

Example 23 includes the method of example 17, wherein the driver circuit is a matrix driver circuit, further including coupling an assist driver circuit to the second side of the substrate.

The following claims are hereby incorporated into this Detailed Description by this reference. Although certain example systems, methods, apparatus, and articles of manufacture have been disclosed herein, the scope of coverage of this patent is not limited thereto. On the contrary, this patent covers all systems, methods, apparatus, and articles of manufacture fairly falling within the scope of the claims of this patent.

What is claimed is:

1. An apparatus for a micro-light emitting diode (micro-LED) display, the apparatus comprising:
   a substrate;
   a micro-LED matrix on a first side of the substrate;
   a matrix driver circuit on a second side of the substrate, the second side opposite the first side;
   at least one of an assist driver circuit or a timing controller on the second side of the substrate;
   a first conductive path in the substrate to extend between the first side and the second side to electrically couple the micro-LED matrix to the matrix driver circuit; and
   a second conductive path in the substrate to electrically couple the at least one of the assist driver circuit or the timing controller to the matrix driver circuit.

2. The apparatus of claim 1, wherein the substrate is a polyimide substrate.

3. The apparatus of claim 1, wherein the matrix driver circuit is to control a plurality of pixels of the micro-LED display.

4. The apparatus of claim 1, further including a package resin layer to envelop the micro-LED matrix.

5. The apparatus of claim 1, wherein the matrix driver circuit is a first matrix driver circuit to control operation of first LEDs in the micro-LED matrix, further including a second matrix driver circuit on the second side of the substrate, the second matrix driver circuit to control operation of second LEDs in the micro-LED matrix.

6. The apparatus of claim 1, further including a second substrate coupled to the first side of the substrate, the first side of the substrate facing a third side of the second substrate, the micro-LED matrix coupled to a fourth side of the second substrate, the fourth side opposite the third side, the second substrate to electrically couple the micro-LED matrix to the matrix driver circuit.

7. The apparatus of claim 1, further including:
   a first contact pad on the first side of the substrate, the first contact pad to protrude from the first side of the substrate; and
   a second contact pad on the second side of the substrate, the second contact pad substantially level with the second side of the substrate, the first conductive path coupled between the first contact pad and the second contact pad.

8. The apparatus of claim 1, wherein the micro-LED matrix is a first micro-LED matrix, the matrix driver circuit is a first matrix driver circuit, further including:
   a second micro-LED matrix on the first side of the substrate;
   a second matrix driver circuit on the second side of the substrate;
   a second substrate disposed between the first micro-LED matrix and the substrate, the substrate and the second substrate to electrically couple the first matrix driver circuit to the first micro-LED matrix; and
   a third substrate disposed between the second micro-LED matrix and the substrate, the substrate and the third substrate to electrically couple the second matrix driver circuit to the second micro-LED matrix.

9. An apparatus for a micro-light emitting diode (micro-LED) display, the apparatus comprising:
   a polyimide substrate;
   a micro-LED matrix on a first side of the polyimide substrate;
   a driver circuit on a second side of the polyimide substrate; and
   a printed circuit board coupled to the second side of the polyimide substrate, the second side of the polyimide substrate facing a third side of the printed circuit board, the driver circuit coupled to a fourth side of the printed circuit board opposite the third side, the polyimide substrate and the printed circuit board to electrically couple the driver circuit to micro-LEDs of the micro-LED matrix.

10. An apparatus for a micro-light emitting diode (micro-LED) display, the apparatus comprising:
    a first substrate;
    a first micro-LED matrix on a first side of the first substrate;
    a driver circuit on a second side of the first substrate;
    a second substrate coupled to the second side of the first substrate, the second side of the first substrate facing a third side of the second substrate, the driver circuit coupled to a fourth side of the second substrate opposite the third side, the first substrate and the second substrate to electrically couple the driver circuit to micro-LEDs of the first micro-LED matrix; and
    a second micro-LED matrix coupled to a third substrate on the third side of the second substrate.

11. The apparatus of claim 10, wherein the driver circuit is a first matrix driver circuit and the micro-LEDs are first micro-LEDs, further including a second matrix driver circuit on the fourth side of the second substrate, the second substrate to electrically couple the second matrix driver circuit to second micro-LEDs of the second micro-LED matrix.

12. An apparatus, comprising:
    an array of micro-light emitting diodes (micro-LEDs);
    an integrated circuit (IC) chip to drive micro-LEDs in the array of micro-LEDs;

a substrate disposed between the array of micro-LEDs and the IC chip, the substrate to electrically couple the array of micro-LEDs and the IC chip;

a first contact pad on a first side of the substrate, the first contact pad to protrude from a first surface of the substrate;

a second contact pad on a second side of the substrate, the second contact pad substantially level with a second surface of the substrate; and a conductive path in the substrate, the conductive path coupled between the first contact pad and the second contact pad.

13. The apparatus of claim 12, wherein the IC chip is a first IC chip and the array of micro-LEDs is a first array of micro-LEDs, further including a second IC chip to drive micro-LEDs in a second array of micro-LEDs, the substrate disposed between the second array of micro-LEDs and the second IC chip.

14. The apparatus of claim 13, wherein the substrate is a first substrate, further including:
 a second substrate disposed between the first array of micro-LEDs and the first substrate; and
 a third substrate disposed between the second array of micro-LEDs and the first substrate.

15. An apparatus comprising:
 a first array of micro-light emitting diodes (micro-LEDs) and a second array of micro-LEDs;
 a first integrated circuit (IC) chip to drive first micro-LEDs in the first array of micro-LEDs;
 a second IC chip to drive second micro-LEDs in the second array of micro-LEDs;
 a first substrate disposed between the first array of micro-LEDs and the first IC chip and between the second array of micro-LEDs and the second IC chip;
 a second substrate disposed between the first array of micro-LEDs and the first substrate, the first substrate and the second substrate to electrically couple the first array of micro-LEDs and the first IC chip; and
 a third substrate disposed between the second array of micro-LEDs and the first substrate, the first substrate and the third substrate to electrically couple the second array of micro-LEDs and the second IC chip.

16. The apparatus of claim 15, wherein the first substrate is a printed circuit board and the second and third substrates include a polyimide material.

17. The apparatus of claim 15, further including:
 a first contact pad on a first side of the second substrate, the first contact pad to protrude from the first side of the second substrate;
 a second contact pad on a second side of the second substrate opposite the first side, the second contact pad substantially level with the second side of the second substrate; and
 a conductive path in the second substrate, the conductive path coupled between the first contact pad and the second contact pad.

18. An apparatus for a micro-light emitting diode (micro-LED) display, the apparatus comprising:
 a first substrate;
 a first micro-LED matrix on a first side of the first substrate;
 a driver circuit on a second side of the first substrate;
 a second substrate coupled to the second side of the first substrate, the second side of the first substrate facing a third side of the second substrate, the driver circuit coupled to a fourth side of the second substrate opposite the third side, the first substrate and the second substrate to electrically couple the driver circuit to micro-LEDs of the first micro-LED matrix;
 a first contact pad on the first side of the first substrate, the first contact pad to protrude from the first side of the first substrate;
 a second contact pad on the second side of the first substrate, the second contact pad substantially level with the second side of the first substrate; and
 a conductive path in the first substrate, the conductive path coupled between the first contact pad and the second contact pad.

* * * * *